(12) United States Patent
Yamashita et al.

(10) Patent No.: US 12,368,108 B2
(45) Date of Patent: Jul. 22, 2025

(54) ELECTRONIC MODULE AND ELECTRONIC DEVICE

(71) Applicant: CANON KABUSHIKI KAISHA, Tokyo (JP)

(72) Inventors: Nobuaki Yamashita, Kanagawa (JP); Takashi Numagi, Tokyo (JP); Kunihiko Uchida, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 415 days.

(21) Appl. No.: 18/070,602

(22) Filed: Nov. 29, 2022

(65) Prior Publication Data

US 2023/0187369 A1    Jun. 15, 2023

(30) Foreign Application Priority Data

Dec. 13, 2021    (JP) ................................. 2021-201846

(51) Int. Cl.
| | | |
|---|---|---|
| *H01L 23/538* | (2006.01) | |
| *H01L 23/00* | (2006.01) | |
| *H10B 80/00* | (2023.01) | |
| *H01L 25/18* | (2023.01) | |

(52) U.S. Cl.
CPC .......... *H01L 23/5386* (2013.01); *H01L 24/14* (2013.01); *H01L 24/16* (2013.01); *H10B 80/00* (2023.02); *H01L 25/18* (2013.01); *H01L 2224/14155* (2013.01); *H01L 2224/16225* (2013.01); *H01L 2924/14361* (2013.01)

(58) Field of Classification Search
CPC ...... H01L 23/5386; H01L 24/14; H10B 80/00
USPC .......................................................... 361/764
See application file for complete search history.

(56) References Cited

U.S. PATENT DOCUMENTS

| | | |
|---|---|---|
| 9,084,364 B2 | 7/2015 | Hoshi |
| 9,326,370 B2 | 4/2016 | Murai |
| 9,907,155 B2 | 2/2018 | Numagi |
| 10,306,761 B2 | 5/2019 | Numagi |
| 10,716,211 B2 | 7/2020 | Numagi |
| 11,480,910 B2 | 10/2022 | Numagi |
| 2009/0250252 A1 | 10/2009 | Ho et al. |
| 2010/0126760 A1 | 5/2010 | Ishikawa |

(Continued)

FOREIGN PATENT DOCUMENTS

| | | |
|---|---|---|
| JP | H10-303521 A | 11/1998 |
| JP | 2004-311870 A | 11/2004 |

(Continued)

*Primary Examiner* — Andargie M Aychillhum
(74) *Attorney, Agent, or Firm* — Venable LLP

(57) ABSTRACT

An electronic module includes a wiring board having a first main surface and a second main surface on a back side of the first main surface, and a first semiconductor element and a second semiconductor element that are mounted on the wiring board. The first semiconductor element includes a first signal terminal and a second signal terminal. The second semiconductor element includes a third signal terminal and a fourth signal terminal. The wiring board includes a first signal line including a first signal trace disposed in a first conductor layer, a second signal line including a second signal trace disposed in a second conductor layer that is closer to the second main surface than the first conductor layer is, a first ground trace disposed in the first conductor layer, and a second ground trace disposed in the second conductor layer.

20 Claims, 12 Drawing Sheets

(56) References Cited

U.S. PATENT DOCUMENTS

| | | | |
|---|---|---|---|
| 2012/0086125 A1* | 4/2012 | Kang | .................... H01L 23/481 |
| | | | 257/737 |
| 2017/0171978 A1* | 6/2017 | Yang | ....................... H01L 24/20 |
| 2022/0304144 A1 | 9/2022 | Kondo | |
| 2022/0321781 A1 | 10/2022 | Yamashita | |

FOREIGN PATENT DOCUMENTS

| JP | 2006-024618 A | 1/2006 |
|---|---|---|
| JP | 2013-069730 A | 4/2013 |
| JP | 2016-213340 A | 12/2016 |
| JP | 2019114704 A | 7/2019 |

\* cited by examiner

ELECTRONIC MODULE AND ELECTRONIC DEVICE

BACKGROUND OF THE INVENTION

Field of the Invention

The present disclosure relates to an electronic module and an electronic device.

Description of the Related Art

As an example of an electronic module incorporated in an electronic device, Japanese Patent Laid-Open No. 2016-213340 discloses a control apparatus including a control circuit, a double data rate 3: DDR3 memory, and a control board on which the control circuit and the DDR3 memory are disposed. The control circuit and the DDR3 memory are each typically constituted by a semiconductor element. The control circuit includes a plurality of signal terminals through which an address signal can be transmitted, and the DDR3 memory includes a plurality of signal terminals through which the address signal can be received. The plurality of signal terminals of the control circuit and the plurality of signal terminals of the DDR3 memory are electrically connected to each other in a one-on-one relationship via signal lines of the control board.

SUMMARY OF THE INVENTION

According to one aspect of the present invention, an electronic module includes a wiring board having a first main surface and a second main surface on a back side of the first main surface, and a first semiconductor element and a second semiconductor element that are mounted on the wiring board. At least one of the first semiconductor element or the second semiconductor element is disposed on a side of the first main surface. The first semiconductor element includes a first signal terminal and a second signal terminal. The second signal terminal is closer to the second semiconductor element than the first signal terminal is. The second semiconductor element includes a third signal terminal and a fourth signal terminal. The fourth signal terminal is closer to the first semiconductor element than the third signal terminal is. The wiring board includes a first signal line configured to electrically interconnect the second signal terminal and the third signal terminal and including a first signal trace disposed in a first conductor layer, a second signal line configured to electrically interconnect the first signal terminal and the fourth signal terminal and including a second signal trace disposed in a second conductor layer that is closer to the second main surface than the first conductor layer is, a first ground trace disposed in the first conductor layer and extending along the first signal trace such that the first signal trace is interposed between two parts of the first ground trace in a width direction of the first signal trace, and a second ground trace disposed in the second conductor layer and extending along the second signal trace such that the second signal trace is interposed between two parts of the second ground trace in a width direction of the second signal trace.

Further features of the present invention will become apparent from the following description of exemplary embodiments with reference to the attached drawings.

DESCRIPTION OF THE EMBODIMENTS

Recently, there has been a demand for miniaturization of an electronic module mounted on an electronic device accompanied by a demand for miniaturization of the electronic device. Accompanied by the miniaturization of the electronic module, deterioration of the quality of signals has arisen as an issue, and improvement in the quality of signals is desired.

The present disclosure is to provide an electronic module in which the signal quality is improved and miniaturization is realized.

Exemplary embodiments of the present disclosure will be described in detail below with reference to drawings.

First Embodiment

Figure 1A:
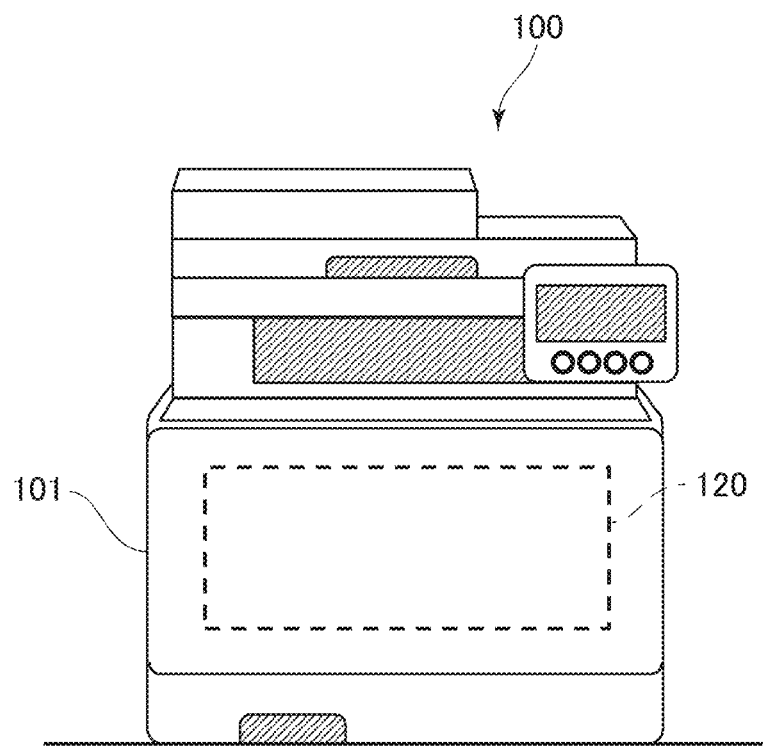
FIG. 1A is a front view of an image forming apparatus serving as an example of an electronic device according to a first embodiment.
Figure 1B:
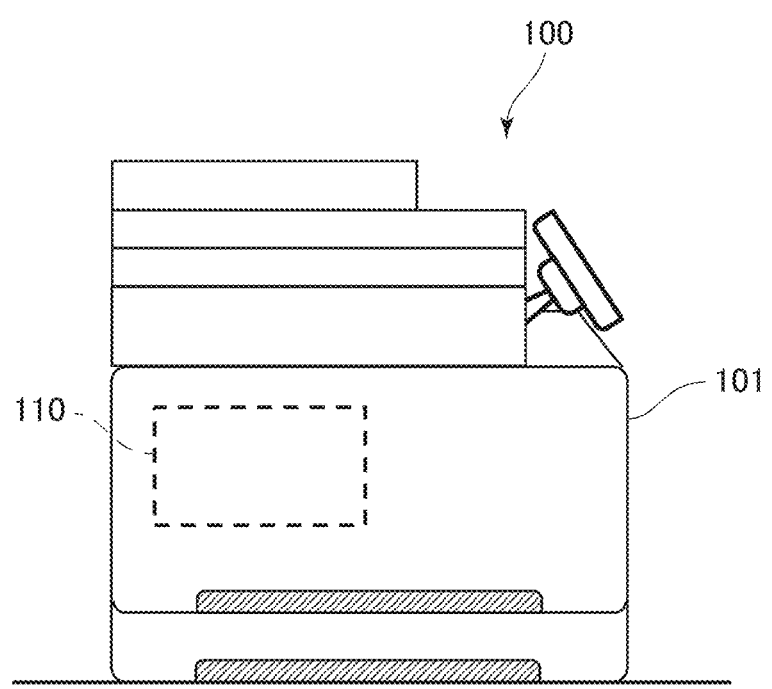
FIG. 1B is a side view of the image forming apparatus according to the first embodiment.

FIG. 1A is a front view of an image forming apparatus 100 serving as an example of an electronic device according to the first embodiment. FIG. 1B is a side view of the image forming apparatus 100 according to the first embodiment. The image forming apparatus 100 is a digital device of an electrophotographic system such as a printer, a copier, a facsimile machine, or a multifunctional apparatus. The image forming apparatus 100 includes a casing 101, an unillustrated sheet conveyance mechanism, an image forming portion 120 that forms an image on a sheet conveyed by the sheet conveyance mechanism, a control module 110 that controls the image forming portion 120. The image forming portion 120, the control module 110, and the unillustrated sheet conveyance mechanism are disposed inside the casing 101. The image forming portion 120 includes a photosensitive drum, a charging portion, a developing portion, a transfer portion, a fixing portion, and the like that are not illustrated.

The control module 110 is an example of an electronic module, and is constituted by a printed circuit board. The control module 110 receives image data from an external device through an interface such as local area network: LAN, or a universal serial bus: USB. Further, the control module 110 processes the received image data, and controls the image forming portion 120 such that the image forming portion 120 forms an image on a sheet.

Figure 2:
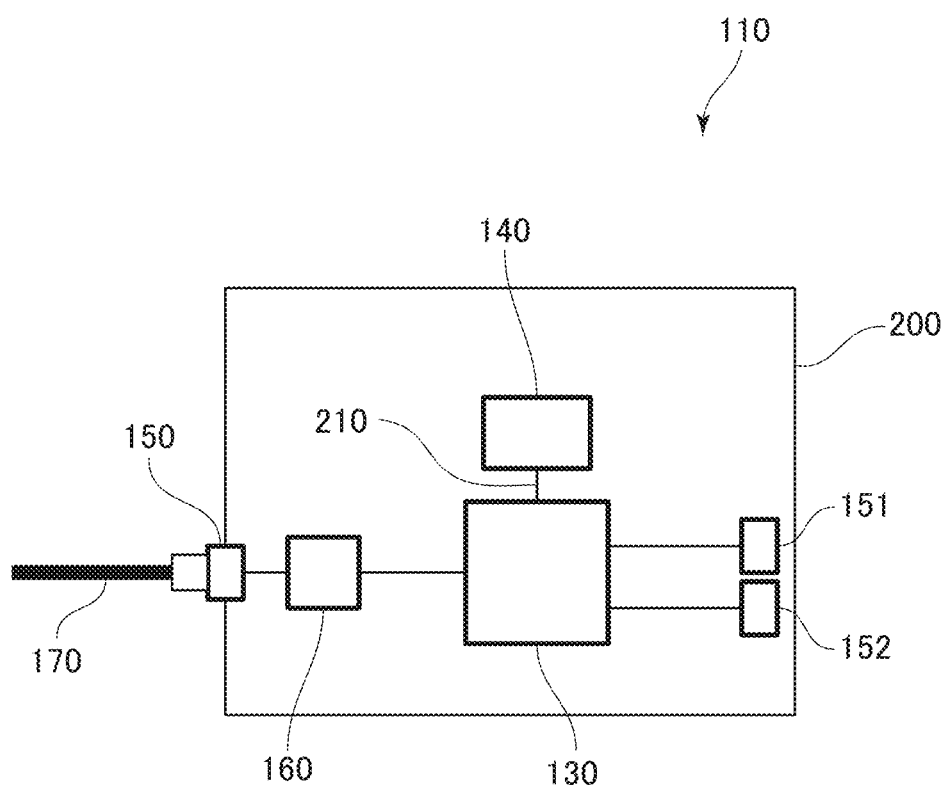
FIG. 2 is an explanatory diagram of a control module according to the first embodiment.

FIG. 2 is an explanatory diagram of the control module 110 according to the first embodiment. The control module 110 includes a memory controller 130 serving as an example of a first semiconductor element, and a memory device 140 serving as an example of a second semiconductor element. In addition, the control module 110 includes connectors 150, 151, and 152, a conversion chip 160, and a printed wiring board 200. The memory controller 130, the memory device 140, the connectors 150, 151, and 152, and the conversion chip 160 are mounted on the printed wiring board 200. The printed wiring board 200 is a rigid printed wiring board.

The memory device 140 is a double data rate 3 synchronous dynamic random access memory: DDR3 SDRAM or a double data rate 4 synchronous dynamic random access memory: DDR4 SDRAM, and the DDR4 SDRAM is preferred. A LAN cable 170 is attached to the connector 150, and image data is received from an external device through the LAN cable 170. The conversion chip 160 processes image data received by the connector 150, and outputs the processed image data to the memory controller 130. The memory controller 130 stores image data in the memory device 140, reads out the image data stored in the memory device 140, and so forth. The memory controller 130 outputs the image data to the connectors 151 and 152, and transmits the image data to the image forming portion 120 illustrated in FIG. 1A connected to the connectors 151 and 152 via unillustrated cables.

The memory controller 130 and the memory device 140 are each constituted by a single semiconductor package. The printed wiring board 200 includes bus wiring 210 constituted by a plurality of lines serving as a communication path for signals communicated between the memory controller 130 and the memory device 140.

The memory controller 130 and the memory device 140 communicate a data signal representing the image data via a data line included in the bus wiring 210. In addition, the memory controller 130 stores and deletes data in the memory device 140 by transmitting an address signal and a command signal to the memory device 140 via a signal line included in the bus wiring 210. A memory system includes the memory controller 130, the memory device 140, and the printed wiring board 200.

Figure 3A:
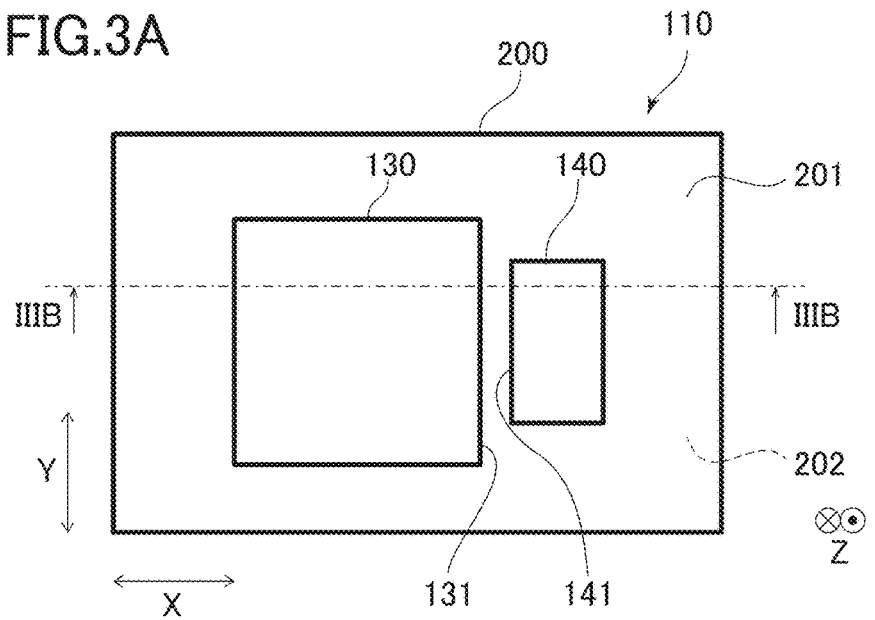
FIG. 3A is a plan view of part of the control module according to the first embodiment.

FIG. 3A is a plan view of part of the control module 110 according to the first embodiment. The memory controller 130 and the memory device 140 are both disposed on a main surface 201 among two main surfaces 201 and 202 of the printed wiring board 200. The main surface 201 serves as an example of a first main surface. The main surface 202 serves as an example of a second main surface. The main surface 202 is a main surface on the back side of the main surface 201. The main surface 201 and the main surface 202 are substantially parallel. A direction perpendicular to the main surfaces 201 and 202 will be referred to as a Z direction. The Z direction also serves as the thickness direction, that is, the lamination direction of the printed wiring board 200. Two directions intersecting the Z direction will be referred to as an X direction and a Y direction. The X direction and the Y direction intersect each other. The X direction, the Y direction, and the Z direction are preferably orthogonal to each other. The memory controller 130 and the memory device 140 are disposed on the printed wiring board 200 so as not to overlap each other as viewed in the Z direction.

The memory controller 130 and the memory device 140 each have a rectangular shape as viewed in the Z direction. The outer shape of the memory controller 130 is larger than the outer shape of the memory device 140 as viewed in the Z direction.

In the first embodiment, the memory controller 130 and the memory device 140 are disposed on the printed wiring board 200 so as to oppose each other in the X direction such that a side 131 of the memory controller 130 and a side 141 of the memory device 140 are parallel to each other as viewed in the Z direction. As viewed in the Z direction, the side 141 of the memory device 140 is a long side. That is, the side 141 extends in the Y direction. In the first embodiment, the X direction also serves as a short direction of the memory device 140, and the Y direction also serves as a longitudinal direction of the memory device 140.

To be noted, parts such as unillustrated capacitors and unillustrated resistors may be mounted on each of the main surfaces 201 and 202.

Figure 3B:
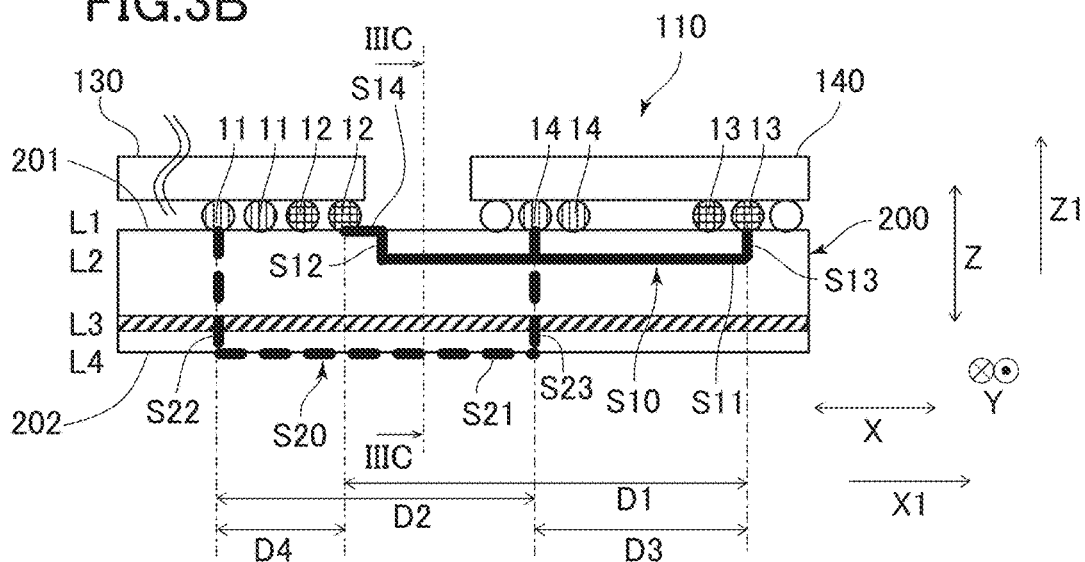
FIG. 3B is a section view of the control module according to the first embodiment.
Figure 3C:
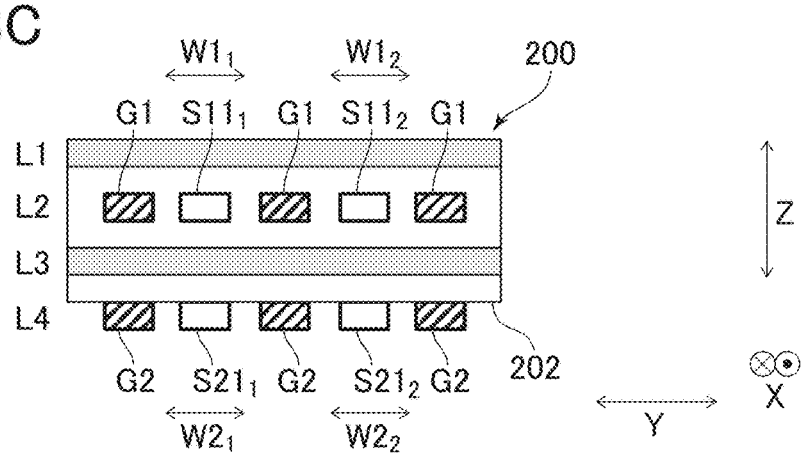
FIG. 3C is a section view of a printed wiring board according to the first embodiment.

FIG. 3B is a section view of the control module 110 according to the first embodiment. FIG. 3B schematically illustrates a cross-section of the control module 110 taken along a line illustrated in FIG. 3A. FIG. 3C is a section view of the printed wiring board 200 according to the first embodiment. FIG. 3C schematically illustrates a cross-section of the printed wiring board 200 taken along a line of FIG. 3B.

The printed wiring board 200 includes an insulating substrate and a conductive wiring. The substrate is formed from an insulator such as an epoxy resin. The wiring is formed from a conductor such as copper. In the first embodiment, the printed wiring board 200 is a through via board. By using a through via board as the printed wiring board 200, the productivity can be high, and the manufacturing cost can be low.

The printed wiring board 200 is a laminated board including at least four conductor layers L1 to L4. The conductor layers L1 to L4 are arranged at intervals in the Z direction.

An insulating material, that is, an insulating layer is provided in each gap between the conductor layers L1 to L4. The conductor layers L1 to L4 are arranged in the order of the conductor layer L1, the conductor layer L2, the conductor layer L3, and the conductor layer L4 from the main surface 201 toward the main surface 202.

The conductor layer L1 is provided on the main surface 201 serving as a mounting surface. The conductor layer L1 serves as an example of a first outer layer. The conductor layer L4 is provided on the main surface 202 serving as a mounting surface. The conductor layer L4 serves as an example of a second outer layer. The conductor layer L2 serves as an example of a first inner layer disposed inside the printed wiring board 200. The conductor layer L3 serves as an example of a second inner layer disposed inside the printed wiring board 200. The conductor layer L3 is present between the conductor layer L2 and the conductor layer L4, that is, the main surface 202. Therefore, the conductor layer L3 is positioned farther from the conductor layer L2 than the main surface 201.

To be noted, an unillustrated solder resist may be disposed on the conductor layer L1. In addition, an unillustrated solder resist may be disposed on the conductor layer L4. A conductor pattern constituting the wiring is provided in each of the conductor layers L1 to L4 of the printed wiring board 200. The printed wiring board 200 is provided with a through via penetrating the conductor layers L1 to L4 and constituting the wiring. The through via is a conductor disposed in a through hole.

The memory controller 130 is bonded to the printed wiring board 200 via, for example, solder. The memory device 140 is bonded to the printed wiring board 200 via, for example, solder. The memory controller 130 and the memory device 140 each have a package structure of a ball grid array: BGA or a land grid array: LGA, and includes a plurality of terminals arranged in an array. The memory controller 130 and the memory device 140 each include a plurality of signal terminals, a plurality of power terminals, and a plurality of ground terminals.

A data terminal that is one kind of the signal terminals of the memory controller 130 and a data terminal of the memory device 140 are electrically interconnected by an unillustrated data line of the printed wiring board 200. Due to improvement of the function of the image forming apparatus 100 that is an electronic device, big data is processed.

The memory controller 130 includes a plurality of signal terminals 11, and a plurality of signal terminals 12 that are closer to the memory device 140 than each of the plurality of signal terminals 11 is. The memory device 140 includes a plurality of signal terminals 13, and a plurality of signal terminals 14 that are closer to the memory controller 130 than each of the plurality of signal terminals 13 is. Focusing on one of the plurality of signal terminals 11, one of the plurality of signal terminals 12, one of the plurality of signal terminals 13, and one of the plurality of signal terminals 14, the signal terminal 12 is closer to the memory device 140 than the signal terminal 11 is, and the signal terminal 14 is closer to the memory controller 130 than the signal terminal 13 is. To be noted, in FIG. 3B, each of the signal terminals 11 and the signal terminals 14 is indicated by hatching of vertical lines. In addition, in FIG. 3B, each of the signal terminals 12 and the signal terminals 13 is indicated by lattice hatching.

The signal terminals 11 each serve as an example of a first signal terminal. The signal terminals 12 each serve as an example of a second signal terminal. The signal terminals 13 each serve as an example of a third signal terminal. The signal terminals 14 each serve as an example of a fourth signal terminal.

The signal terminals 11 and 12 of the memory controller 130 are each a terminal for transmitting an address signal or a command signal. Hereinafter, this signal will be referred to as an address/command signal. The signal terminals 13 and 14 of the memory device 140 are each a terminal for receiving the address/command signal.

The printed wiring board 200 includes a plurality of signal lines S10 that electrically connect the plurality of signal terminals 12 of the memory controller 130 to the plurality of signal terminals 13 of the memory device 140 in a one-on-one relationship. In addition, the printed wiring board 200 includes a plurality of signal lines S20 that electrically connect the plurality of signal terminals 11 of the memory controller 130 to the plurality of signal terminals 14 of the memory device 140 in a one-on-one relationship.

The signal lines S10 each serve as an example of a first signal line. The signal lines S20 each serve as an example of a second signal line. The wiring width of each of the signal lines S10 and S20 is preferably 75 µm or more. To be noted, FIG. 3B illustrates only one signal line S10 and one signal line S20.

Figure 12A:
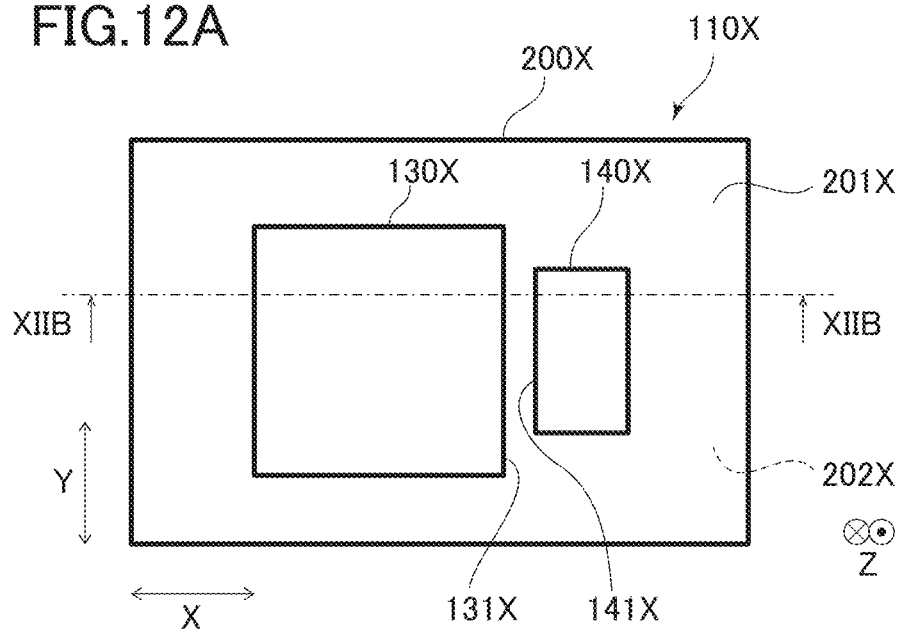
FIG. 12A is a plan view of part of a control module of a comparative example.
Figure 12B:
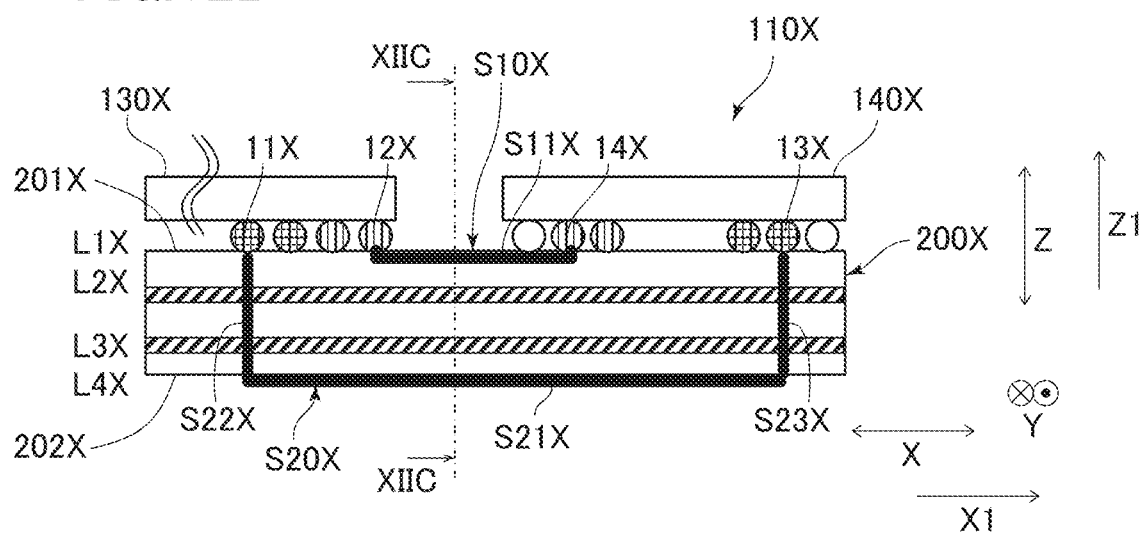
FIG. 12B is a section view of the control module of the comparative example.
Figure 12C:
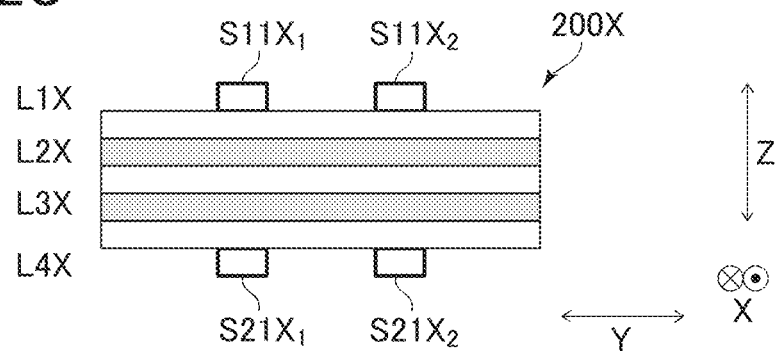
FIG. 12C is a section view of a printed wiring board of the comparative example.

Here, a control module of a comparative example will be described. FIG. 12A is a plan view of part of a control module 110X of a comparative example. A memory controller 130X and a memory device 140X are both disposed on a main surface 201X among two main surfaces 201X and 202X of a printed wiring board 200X. FIG. 12B is a section view of the control module 110X of the comparative example. FIG. 12B schematically illustrates a cross-section of the control module 110X taken along a line XIIB-XIIB illustrated in FIG. 12A. FIG. 12C is a section view of the printed wiring board 200X of the comparative example. FIG. 12C schematically illustrates a cross-section of the printed wiring board 200X taken along a line XIIC-XIIC of FIG. 12B.

The memory controller 130X and the memory device 140X each have a rectangular shape as viewed in the Z direction. The outer shape of the memory controller 130X is larger than the outer shape of the memory device 140X as viewed in the Z direction.

In the comparative example, the memory controller 130X and the memory device 140X are disposed on the printed wiring board 200X so as to oppose each other in the X direction such that a side 131X of the memory controller 130X and a side 141X of the memory device 140X are parallel to each other as viewed in the Z direction. As viewed in the Z direction, the side 141X of the memory device 140X is a long side.

The printed wiring board 200X is a laminated board including at least four conductor layers L1X to L4X. The conductor layers L1X to L4X are arranged in the order of the conductor layer L1X, the conductor layer L2X, the conductor layer L3X, and the conductor layer L4X from the main surface 201X toward the main surface 202X.

The memory controller 130X includes a plurality of signal terminals 11X, and a plurality of signal terminals 12X that are closer to the memory device 140X than each of the plurality of signal terminals 11X is. The memory device 140X includes a plurality of signal terminals 13X, and a plurality of signal terminals 14X that are closer to the memory controller 130X than each of the plurality of signal terminals 13X is. The signal terminals 11X and 12X of the memory controller 130X are each a terminal for transmitting an address/command signal. The signal terminals 13X and 14X of the memory device 140X are each a terminal for receiving the address/command signal.

The printed wiring board 200X includes a plurality of signal lines S10X that electrically connect the plurality of signal terminals 12X of the memory controller 130X to the plurality of signal terminals 14X of the memory device 140X in a one-on-one relationship. In addition, the printed wiring board 200X includes a plurality of signal lines S20X that electrically connect the plurality of signal terminals 11X of the memory controller 130X to the plurality of signal terminals 13X of the memory device 140X in a one-on-one relationship.

The signal lines S10X are each constituted by a signal trace S11X disposed in the conductor layer L1X. In contrast, the signal lines S20X each include a signal trace S21X disposed in the conductor layer L4X, a signal via 22X that is in contact with the signal terminal 11X and the signal trace S21X, and a signal via 23X that is in contact with the signal terminal 13X and the signal trace S21X. The signal vias 22X and 23X are each a through via. The signal lines S10X do not include a signal via that is a through via. In FIG. 12C, a ground trace is disposed in the conductor layer L2X. A power supply trace to which a power potential is applied or a ground trace is disposed in the conductor layer L3X.

If the signal trace S11X of the signal line S10X is provided in a linear shape, the path difference, that is, the wiring length difference between the signal lines S10X and S20X becomes large. When the operating frequency of the signal is increased in a circuit of a timing synchronization type in a memory system, the difference in the delay time between a plurality of signals is increased. When the difference in the delay time derived from the wiring length difference exceeds a predetermined value defined in accordance with the operating frequency of the signal, the possibility of an error in the logical determination by the memory device 140X increases. If there is an error in the logical determination, there is a possibility that a noise is generated in the image, or a malfunction of the electronic device occurs. Therefore, the path difference between the signal lines S10X and S20X needs to be reduced.

Therefore, in the comparative example, by providing the signal trace S11X of the signal line S10X in a meandering manner, the path difference can be reduced. However, a large wiring area is needed for providing the signal trace S11X in a meandering manner. That is, the wiring pitch of the meandering signal trace S11X is set such that the electromagnetic coupling is small in order to reduce self crosstalk of the signal trace S11X. In addition, in two signal lines S10X, two signal traces S11X opposing each other in the Y direction will be referred to as signal traces $S11X_1$ and $S11X_2$. Similarly, in two signal lines S20X, two signal traces S21X opposing each other in the Y direction will be referred to as signal traces $S21X_1$ and $S21X_2$. The wiring pitch between the signal traces $S11X_1$ and $S11X_2$ and the wiring pitch between the signal traces $S21X_1$ and $S21X_2$ are also set such that the electromagnetic coupling is small in order to reduce crosstalk.

As described above, the crosstalk between the two signal traces $S11X_1$ and $S11X_2$, the crosstalk between the two signal traces $S21X_1$ and $S21X_2$, and the self crosstalk in each of the signal traces $S11X_1$ and $S11X_2$ need to be reduced. To reduce these crosstalks, the wiring pitch needs to be increased, and therefore an even larger wiring area is needed. For example, the thickness from each of the signal traces $S11X_1$ and $S11X_2$ to the ground layer with an insulating layer therebetween is set to 100 μm. In the case where the self wiring pitch of each of the meandering signal traces $S11X_1$ and $S11X_2$ and the pitch between the signal traces $S11X_1$ and $S11X_2$ is set to be three times of the pitch between each of the signal traces $S11X_1$ and $S11X_2$ and the ground layer, the minimum wiring pitch is 300 μm. If the signal lines S10X that are short wiring are provided in a meandering manner to reduce the difference between the wiring length of the signal line S10X and the wiring length of the signal line S20X while securing a pitch of 300 μm, the wiring area increases.

Also in the case where, for example, a DDR4 SDRAM is used as the memory device 140X to further accelerate the memory system, the shape and pitch of solder balls are the same as in a DDR3 SDRAM. Therefore, the issue described above also arises in the case where the memory device 140X is a DDR4 SDRAM. In addition, since the DDR4 SDRAM operates at a higher speed than the DDR3 SDRAM, the wiring area for the meandering wiring to reduce the wiring length and thus reduce the difference in the delay time increases.

In addition, to employ a wiring structure in which all the bus wiring in the control module 110X described in the comparative example is connected in the shortest path, for example, the wiring width or the wiring pitch of the printed wiring board 200X needs to be less than 75 μm, or the shape of pads of the memory device 140X needs to be small. Therefore, an issue that the productivity of the printed wiring board 200X or mountability of the parts decreases arises.

Therefore, in the first embodiment, the terminal layout of the memory controller 130 is varied from the terminal layout of the memory controller 130X, and the wiring structure of the printed wiring board 200 is varied from the wiring structure of the printed wiring board 200X of the comparative example. To be noted, the terminal layout of the memory device 140 of the first embodiment is substantially the same as the terminal layout of the memory device 140X of the comparative example. Description will be given below with reference to FIGS. 3A to 3C.

In the first embodiment, the memory controller 130 and the memory device 140 are disposed as close as possible to each other. Among signals that are used for communication between the memory controller 130 and the memory device 140 and need to be synchronized, the number of signals is the largest for the address/command signal.

Since the plurality of signal lines S10 of the first embodiment each have substantially the same wiring structure, description will be given focusing on one of the signal lines S10. Since the plurality of signal lines S20 of the first embodiment each have substantially the same wiring structure, description will be given focusing on one of the signal lines S20. For the memory controller 130, description will be given focusing on one of the signal terminals 11 and one of the signal terminals 12, and for the memory device 140, description will be given focusing on one of the signal terminals 13 and one of the signal terminals 14. In the first embodiment, as illustrated in FIG. 3B, a distance D1 between the signal terminal 12 and the signal terminal 13 is larger than a distance D2 between the signal terminal 11 and the signal terminal 14.

The signal line S10 electrically interconnecting the signal terminal 12 and the signal terminal 13 includes a signal trace S11 serving as an example of a first signal trace. The signal trace S11 is disposed in the conductor layer L2. The signal line S20 electrically interconnecting the signal terminal 11 and the signal terminal 14 includes a signal trace S21 serving as an example of a second signal trace. The signal trace S21 is disposed in the conductor layer L4. That is, the signal trace S21 is disposed on the main surface 202. To be noted, an unillustrated power supply trace or an unillustrated ground trace may be disposed in each of the conductor layer L1 and the conductor layer L3.

The signal line S10 includes a signal via S12, a signal via S13, and a signal trace S14. The signal trace S14 is disposed in the conductor layer L1, and is electrically connected to the signal terminal 12 by being contact with the signal terminal 12.

The signal via S12 is a via conductor that electrically interconnects the signal terminal 12 and the signal trace S11 by being in contact with the signal trace S14 of the conductor layer L1 connected to the signal terminal 12 and the signal trace S11 of the conductor layer L2. In the present embodiment, the signal via S12 is a portion between the conductor layer L1 and the conductor layer L2 in the through via.

The signal via S13 is a via conductor that electrically interconnects the signal terminal 13 and the signal trace S11 by being in contact with an unillustrated signal trace of the conductor layer L1 connected to the signal terminal 13 and the signal trace S11 of the conductor layer L2. In the present embodiment, the signal via S13 is a portion between the conductor layer L1 and the conductor layer L2 in the through via.

In addition, the signal line S20 includes a signal via S22 and a signal via S23. The signal via S22 is a via conductor that electrically interconnects the signal terminal 11 and the signal trace S21 by being in contact with an unillustrated signal trace of the conductor layer L1 connected to the signal terminal 11 and the signal trace S21 of the conductor layer L4. This via conductor is a through via.

The signal via S23 is a via conductor that electrically interconnects the signal terminal 14 and the signal trace S21 by being in contact with an unillustrated signal trace of the conductor layer L1 connected to the signal terminal 14 and the signal trace S21 of the conductor layer L4. This via conductor is a through via.

In the first embodiment, the signal line S10 includes the signal vias S12 and S13 as a result of the signal trace S11 being disposed in the conductor layer L2 serving as a first inner layer. Therefore, the path length, that is, the wiring length of the signal line S10 is adjusted by the signal vias S12 and S13. As a result of this, the wiring area can be reduced as compared with the case of the comparative example where the signal trace S11X is provided in a meandering manner, regardless of whether or not the signal line S10 is provided in a meandering manner.

As described above, since the signal line S10 and the signal line S20 have the wiring structures described above in the printed wiring board 200, the difference between the path length of the signal line S10 and the path length of the signal line S20 is reduced. Therefore, the meandering wiring of the signal lines S10 and S20 can be shortened or omitted, thus the wiring area of each of the signal lines S10 and S20 as viewed in the Z direction can be reduced, and the difference in the delay time of the address/command signal between the signal terminals 13 and 14 can be reduced. Therefore, the quality of the signals is improved, and miniaturization of the printed wiring board 200, that is, miniaturization of the control module 110 can be realized.

Figure 4:
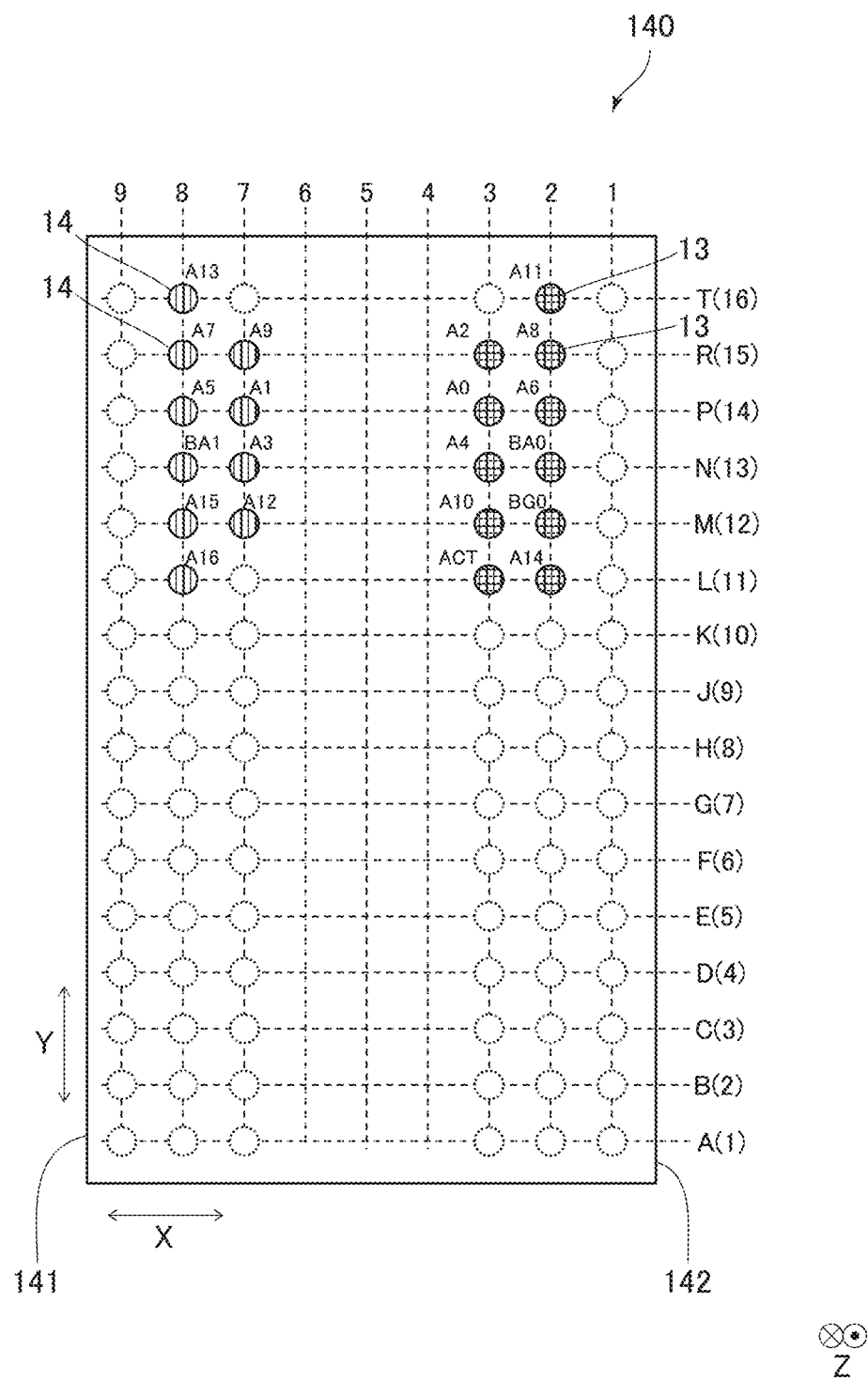
FIG. 4 is a plan view of a layout of terminals of a memory device according to the first embodiment.

FIG. 4 is a plan view illustrating a layout of terminals in the memory device 140 according to the first embodiment. FIG. 4 illustrates the memory device 140 as viewed from the side opposite to the side where the terminals are arranged. In FIG. 4, each terminal is indicated by a broken line.

The memory device 140 is, for example, a DDR4 SDRAM. The plurality of terminals including signal terminals, power terminals, and ground terminals are arranged in an array shape in the first to third columns and the seventh to ninth columns among 16 rows×9 columns. No terminal is provided in the fourth to sixth columns. The total number of the terminals of the memory device 140 is 96.

In FIG. 4, among the plurality of terminals of the memory device 140, terminals A0 to A16, BA0, BA1, BG0, and ACT are the signal terminals 13 and 14 for receiving the address/command signal. In the example of FIG. 4, the total number of terminals of the signal terminals 13 and 14 is 21. The signal terminals 13 and 14 are arranged in the eleventh to sixteenth rows. In addition, the signal terminals 14 are arranged in the seventh and eighth columns, and the signal terminals 13 are arranged in the second and third columns. In addition, the signal terminals 13 and 14 are arranged in L (11th) to T (16th) rows among A (1st) to T (16th) rows.

The memory device 140 may determine the installation orientation of the memory controller 130 in accordance with the positions of the terminals. In the first embodiment, the side 141 is caused to oppose the side 131 of the memory controller 130 illustrated in FIG. 3A. Therefore, in the example of FIG. 4, the terminals A0, A2, A4, A6, A8, A10, A11, A14, BA0, BG0, and ACT in the second and third columns each serve as a third signal terminal. In addition, the terminals A1, A3, A5, A7, A9, A12, A13, A15, A16, and BA1 in the seventh and eighth columns each serve as a fourth signal terminal.

To be noted, in the case where the side 142 of the memory device 140 is caused to oppose the side 131 of the memory controller 130 illustrated in FIG. 3A, the terminals A0, A2, A4, A6, A8, A10, A11, A14, BA0, BG0, and ACT in the second and third columns each serve as a fourth signal terminal. In addition, the terminals A1, A3, A5, A7, A9, A12, A13, A15, A16, and BA1 in the seventh and eighth columns each serve as a third signal terminal.

As illustrated in FIG. 4, the interval between the signal terminals 13 in the third column and the signal terminals 14 in the seventh column is larger than the pitch of the plurality of signal terminals 13 and the pitch of the plurality of signal terminals 14. Therefore, as illustrated in FIG. 3B, a distance D3 between the signal terminals 13 and the signal terminals 14 is larger than a distance D4 between the signal terminals 11 and the signal terminals 12. In such a positional relationship of the terminals, it is preferable that the signal lines S10 and S20 each have the wiring structure described above.

Figure 5A:
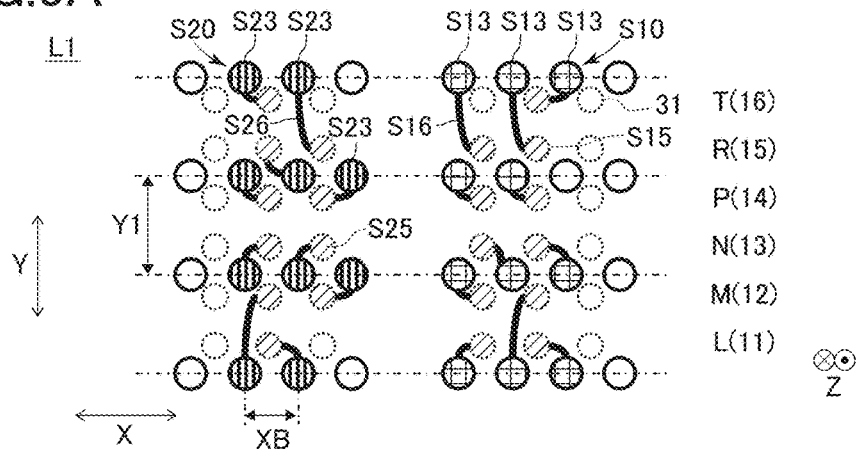
FIG. 5A is a plan view of a wiring structure in part of a first outer layer of the printed wiring board according to the first embodiment.
Figure 5B:
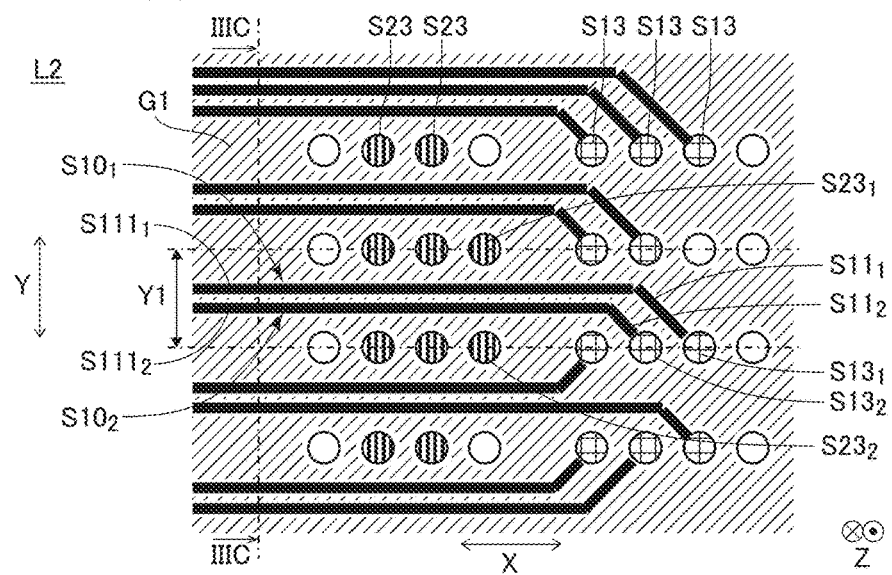
FIG. 5B is a plan view of a wiring structure in part of a first inner layer of the printed wiring board according to the first embodiment.
Figure 5C:
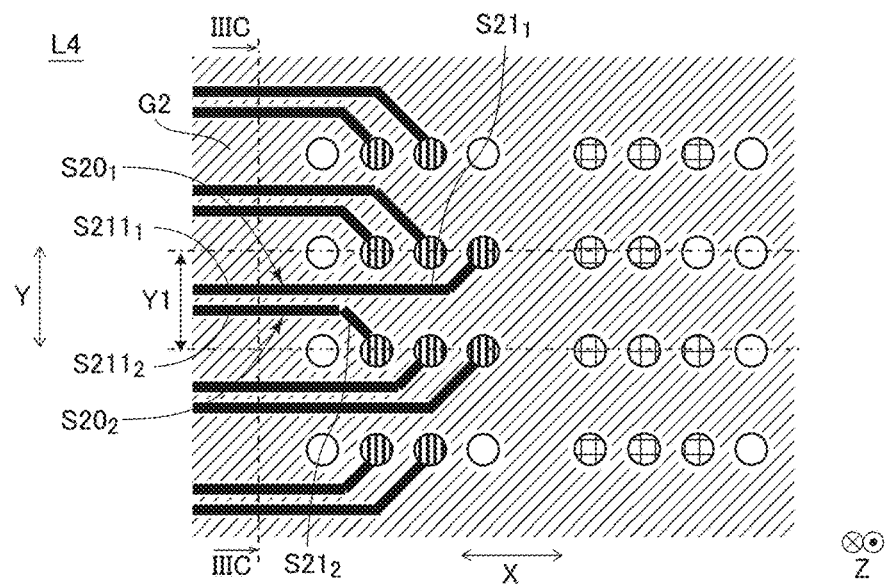
FIG. 5C is a plan view of a wiring structure in part of a second outer layer of the printed wiring board according to the first embodiment.

FIG. 5A is a plan view of the wiring structure of part of the conductor layer L1 in the printed wiring board 200 according to the first embodiment. FIG. 5B is a plan view of the wiring structure of part of the conductor layer L2 in the printed wiring board 200 according to the first embodiment. FIG. 5C is a plan view of the wiring structure of part of the conductor layer L4 in the printed wiring board 200 according to the first embodiment. FIGS. 5A to 5C each illustrate a wiring structure of a region on the printed wiring board 200 where the memory device 140 is mounted and the region in the vicinity thereof.

As illustrated in FIGS. 3C and 5B, two signal traces S11 of two signal lines S10 among the plurality of signal lines S10 will be referred to as signal traces $S11_1$ and $S11_2$. In addition, as illustrated in FIGS. 3C and 5C, two signal traces S21 of two signal lines S20 among the plurality of signal lines S20 will be referred to as signal traces $S21_1$ and $S21_2$.

The printed wiring board 200 includes ground traces G1 and G2. The ground trace G1 serves as an example of a first ground trace. The ground trace G2 serves as an example of a second ground trace. The ground trace G1 is disposed at the same position as the signal traces $S11_1$ and $S11_2$ in the Z direction, that is, disposed in the same conductor layer L2. The ground trace G2 is disposed at the same position as the signal traces $S21_1$ and $S21_2$ in the Z direction, that is, disposed in the same conductor layer L4. That is, the ground trace G2 is disposed on the main surface 202.

The ground trace G1 extends in the X direction along the signal trace $S11_1$ such that the signal trace $S11_1$ is interposed between two parts thereof in a width direction $W1_1$ of the signal trace $S11_1$. Similarly, the ground trace G1 extends in the X direction along the signal trace $S11_2$ such that the signal trace $S11_2$ is interposed between two parts thereof in a width direction $W1_2$ of the signal trace $S11_2$.

In addition, the ground trace G2 extends in the X direction along the signal trace $S21_1$ such that the signal trace $S21_1$ is interposed between two parts thereof in a width direction $W2_1$ of the signal trace $S21_1$. Similarly, the ground trace G2 extends in the X direction along the signal trace $S21_2$ such that the signal trace $S21_2$ is interposed between two parts thereof in a width direction $W2_2$ of the signal trace $S21_2$. In FIG. 3C, the signal traces $S11_1$, $S11_2$, $S21_1$, and $S21_2$ all extend in the X direction, and therefore the width directions $W1_1$, $W1_2$, $W2_1$, and $W2_2$ are parallel to the Y direction.

As described above, in the first embodiment, the ground trace G1 are disposed on both sides of each of the signal traces $S11_1$ and $S11_2$ in the Y direction with insulator therebetween. That is, the ground trace G1 at the reference potential are disposed to oppose each of the signal traces $S11_1$ and $S11_2$ with insulator therebetween such that each of the signal traces $S11_1$ and $S11_2$ is interposed between two parts of the ground trace G1. As a result of the ground trace G1, a path for a return current corresponding to the signal flowing in each of the signal traces $S11_1$ and $S11_2$ can be secured, and thus mismatch of the characteristic impedance in each of the signal lines S10 can be reduced. As a result of this, reflection of signals in each of the signal lines S10 can be reduced. Therefore, the quality of the signals is improved, and further the radiated noise can be reduced. In addition, since the ground trace G1 is present between each pair of signal lines S10, crosstalk in each signal line S10 can be also reduced, and thus the quality of signals can be improved. The same effect is also obtained for the signal lines S20.

To be noted, a power supply trace for supplying a power potential to the memory controller 130 and the memory device 140 can be formed in the conductor layer L3. Alternatively, a power supply trace for supplying a power potential can be formed in the conductor layer L1 to form a ground trace in the conductor layer L3.

As viewed in the Z direction, at least part of the signal trace $S11_1$ overlaps at least part of the signal trace $S21_1$. As a result of this, further miniaturization of the printed wiring board 200 can be realized. As viewed in the Z direction, half or more of the area of the signal trace $S11_1$ preferably overlaps half or more of the area of the signal trace $S21_1$. The signal trace $S11_2$ and the signal trace $S21_2$ are also provided in substantially the same manner. In addition, as viewed in the Z direction, at least part of the ground trace G1 overlaps at least part of the ground trace G2. As a result of this, the ground trace G1 and the ground trace G2 can be interconnected by, for example, a via conductor, and thus it is easier to electrically connect the ground trace G1 to the ground trace G2.

In the first embodiment, each of the plurality of signal lines S10 and the plurality of signal lines S20 used for communication of an address/command signal is configured to include a via conductor. Specifically, a plurality of signal vias corresponding to the plurality of signal terminals 11 are disposed in the vicinity of the plurality of signal terminals 11. A plurality of signal vias corresponding to the plurality of signal terminals 12 are disposed in the vicinity of the plurality of signal terminals 12. A plurality of signal vias corresponding to the plurality of signal terminals 13 are disposed in the vicinity of the plurality of signal terminals 13. A plurality of signal vias corresponding to the plurality of signal terminals 14 are disposed in the vicinity of the plurality of signal terminals 14.

In FIG. 5A, pads 31 to which terminals in the L (11th) to T (16th) rows of the memory device 140 are connected are indicated by dot lines. The plurality of pads 31 are disposed in the conductor layer L1. The plurality of pads 31 include a plurality of pads S15 corresponding to the plurality of signal terminals 13 and a plurality of pads S25 corresponding to the plurality of signal terminals 14. The pads S15 are each a pad to which one of the signal terminals 13 is connected. The pads S25 are each a pad to which one of the signal terminals 14 is connected.

The plurality of signal lines S10 include a plurality of signal vias S13 disposed at positions closer to the memory device 140 than to the memory controller 130. The signal lines S13 respectively correspond to the signal terminals 13. To be noted, the signal vias S13 are each indicated by lattice hatching in FIGS. 5A and 5B.

The plurality of signal lines S20 include a plurality of signal vias S23 disposed at positions closer to the memory device 140 than to the memory controller 130. The signal lines S23 each serve as an example of a first signal via, and respectively correspond to the signal terminals 14. To be noted, the signal vias S23 are each indicated by hatching of vertical lines in FIGS. 5A to 5C.

The plurality of signal vias S13 are respectively connected to the plurality of pads S15 via a plurality of signal traces S16. The plurality of signal traces S16 are disposed in the conductor layer L1. The plurality of signal traces S16 respectively correspond to the pads S15. In addition, the plurality of signal vias S23 are respectively connected to the plurality of pads S25 via a plurality of signal traces S26. The plurality of signal traces S26 are disposed in the conductor layer L1. The plurality of signal traces S26 respectively correspond to the pads S25.

Focusing on one signal line S10, the signal line S10 includes the signal via S13, the pad S15, and the signal trace S16. In addition, focusing on one signal line S20, the signal line S20 includes the signal via S23, the pad S25, and the signal trace S26.

The plurality signal vias S13 are arranged at intervals in the X direction and the Y direction in the vicinity of the plurality of pads S15. The plurality signal vias S23 are arranged at intervals in the X direction and the Y direction in the vicinity of the plurality of pads S25.

Description will be given focusing on two signal lines $S10_1$ and $S10_2$ among the plurality of signal lines S10 in FIG. 5B. As illustrated in FIG. 5B, the signal line $S10_1$ includes a signal trace $S11_1$ that is the signal trace S11, and a signal via $S13_1$ that is the signal via S13. The signal line $S10_2$ includes a signal trace $S11_2$ that is the signal trace S11 different from the signal trace $S11_1$, and a signal via $S13_2$ that is the signal via S13 different from the signal via $S13_1$. The signal trace $S11_1$ includes an extending portion $S111_1$ extending from the memory device 140 toward the memory controller 130. The signal trace $S11_2$ includes an extending portion $S111_2$ extending from the memory device 140 toward the memory controller 130. The extending portions $S111_1$ and $S111_2$ each are a portion extending linearly in the X direction.

The extending portions $S111_1$ and $S111_2$ are each disposed to pass through a gap between two signal vias $S23_1$ and $S23_2$ included in the plurality of signal vias S23 and arranged at an interval in the Y direction intersecting with the X direction in which each of the extending portions $S111_1$ and $S111_2$ extend.

The ground trace G1 is present in gaps between the signal vias $S23_1$ and $S23_2$ and the extending portions $S111_1$ and $S111_2$. Specifically, the ground trace G1 is present in a gap between the signal via $S23_1$ and the extending portion $S111_1$, a gap between the extending portion $S111_1$ and the extending portion $S111_2$, and a gap between the signal via $S23_2$ and the extending portion $S111_2$. In addition, the ground trace G1 is present in gaps between the plurality of signal vias S13, and in gaps between the plurality of signal vias S23. That is, the ground trace G1 is provided in the conductor layer L2 at predetermined intervals from wiring other than the ground so as not to be in contact with the wiring other than the ground. Further, as viewed in the Z direction, the ground trace G1 is formed as a solid pattern in the minimum rectangular region including the plurality of pads S15, the plurality of pads S25, the plurality of signal vias S13, and the plurality of signal vias S23. In the first embodiment, each of all the signal traces S11 is surrounded by the one ground trace G1 formed as a solid pattern.

As a result of the ground trace G1 disposed in the conductor layer L2 being present between the signal traces S11 of the signal lines S10 and the signal vias S23 of the signal lines S20, radiated noise from the signal lines S10 and S20 can be effectively reduced. In addition, crosstalk between the signal traces S11 and the signal vias S23 adjacent to each other with the ground trace G1 therebetween and crosstalk between two signal vias S23 adjacent to each other with the ground trace G1 therebetween can be also effectively reduced.

Further, the signal lines $S10_1$ and $S10_2$ are provided such that two signal traces $S11_1$ and $S11_2$ pass through a gap between two signal vias $S23_1$ and $S23_2$ arranged at an interval in the Y direction among the plurality of signal vias S23. As a result of this, further miniaturization of the printed wiring board 200 can be realized.

In the minimum rectangular region including the plurality of pads S15, the plurality of pads S25, the plurality of signal vias S13, and the plurality of signal vias S23 as viewed in the Z direction, the signal lines S10 and S20 are provided without degrading the productivity of the printed wiring board 200 and the mountability of the memory device 140. Specifically, in the conductor layer L1, only one of the plurality of signal traces S16 or no signal trace S16 is provided between two pads S15 adjacent to each other in the X direction or Y direction among the plurality of pads S15. In addition, in the conductor layer L1, only one of the plurality of signal traces S26 or no signal trace S26 is provided between two pads S25 adjacent to each other in the X direction or Y direction among the plurality of pads S25. As a result of this, in a small region where the memory device 140 is mounted, each of the signal traces S16 and S26 can be set to an appropriate wiring width, and each of the pads S15 and S25 can be set to an appropriate size. Further, the plurality of signal vias S13 and the plurality of signal vias S14 can be disposed in a small region, the plurality of signal traces S11 can be provided to be connected to the plurality of signal vias S13 in the conductor layer L2, and the plurality of signal traces S21 can be provided to be connected to the plurality of signal vias S23 in the conductor layer L4.

To be noted, a terminal indicated by a white broken line circle in FIG. 4, for example, a terminal positioned in the T (16th) row and the third column can be used as a terminal for outputting a parity signal: PAR signal. In addition, through vias indicated by white circles in FIGS. 5A to 5C can be used as power vias or ground vias. In addition, the through vias indicated by white circles in FIGS. 5A to 5C can be omitted. The number of signal lines used for transmission of address/command signals may be determined in accordance with the control module 110, and is not limited to 21.

In addition, in the structure illustrated in FIG. 5A, the plurality of signal vias S13 are preferably formed at a pitch of 0.8 mm in the X direction and 1.6 mm in the Y direction. Similarly, the plurality of signal vias S23 are preferably formed at a pitch of 0.8 mm in the X direction and 1.6 mm in the Y direction.

To be noted, three signal vias S13 included in a signal line S10 corresponding to one signal terminal 13 in the T (16th) row and two signal lines S10 corresponding to two signal terminals 13 in the R (15th) row are disposed outside a region formed by connecting centers of the plurality of pads 31 in the Y direction. As a result of this, all the signal lines S10 can be provided via the conductor layer L2.

Description will be given focusing on two signal lines $S20_1$ and $S20_2$ among the plurality of signal lines S20 in FIG. 5C. As illustrated in FIG. 5C, the signal line $S20_1$ includes a signal trace $S21_1$ that is the signal trace S21. The signal line $S20_2$ includes a signal trace $S21_2$ that is the signal trace S21 different from the signal trace $S21_1$. The signal trace $S21_1$ includes an extending portion $S211_1$ extending from the memory device 140 toward the memory controller 130. The signal trace $S21_2$ includes an extending portion $S211_2$ extending from the memory device 140 toward the memory controller 130. The extending portions $S211_1$ and $S211_2$ each are a portion extending linearly in the X direction.

The ground trace G2 is provided as a solid pattern in the conductor layer L4 at predetermined intervals from wiring other than the ground so as not to be in contact with the wiring other than the ground in the minimum rectangular region described above. In the first embodiment, each of all the signal traces S21 is surrounded by the one ground trace G2 formed as a solid pattern.

Therefore, in the first embodiment, the ground trace G2 disposed in the conductor layer L4 can effectively reduce radiated noise from the signal lines S10 and S20. In addition, crosstalk between two signal lines S20 adjacent to each other with the ground trace G2 therebetween can be also effectively reduced. In addition, the plurality of signal lines S20 can be all provided via the conductor layer L4.

As a result of the wiring structure described above, the plurality of signal lines S10 and the plurality of signal lines S20 can be formed to have as small a path length as possible, and the ground can be formed on both sides of each signal line in the width direction with insulator therebetween.

In addition, the plurality of signal vias S22 included in the plurality of signal lines S20 are disposed at positions overlapping the memory controller 130 as viewed in the Z direction. In contrast, the plurality of signal vias S12 included in the plurality of signal lines S10 are disposed at positions not overlapping the memory controller 130.

Figure 6A:
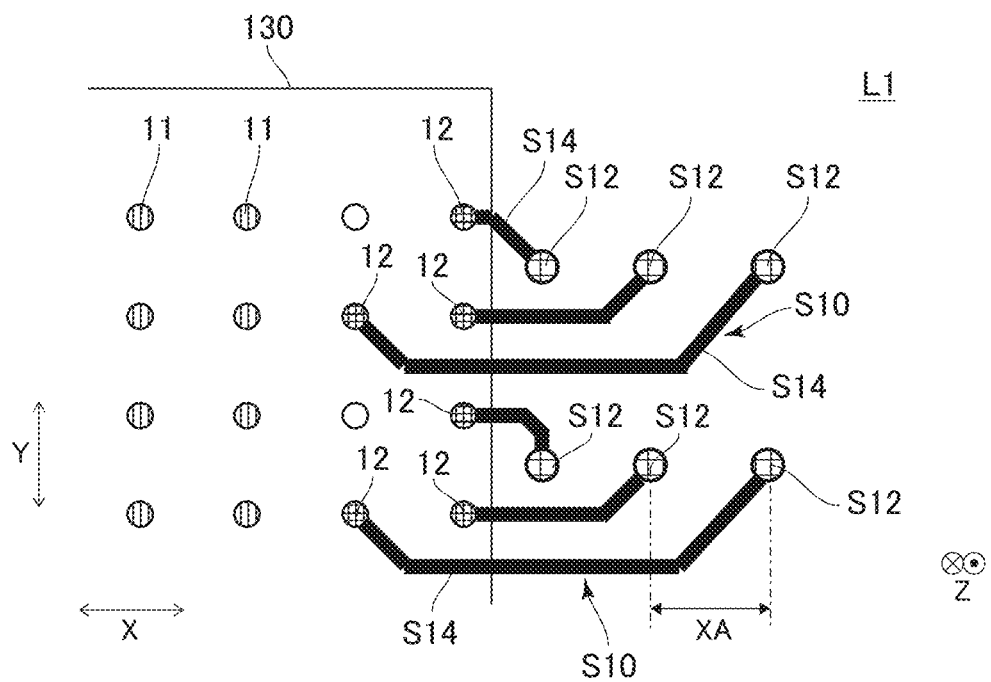
FIG. 6A is a plan view of part of a control unit according to the first embodiment.

FIG. 6A is a partial plan view of part of the control module 110 according to the first embodiment, that is, part of the memory controller 130 and the printed wiring board 200. The signal line S10 includes the signal via S12 disposed at a position closer to the memory controller 130 than to the memory device 140. The signal via S12 serves as an example of a second signal via. That is, the plurality of signal lines S10 include the plurality of signal vias S12 disposed at positions closer to the memory controller 130 than to the memory device 140. The plurality of signal vias S12 are disposed between the memory controller 130 and the memory device 140 as viewed in the Z direction.

The plurality of signal vias S13 illustrated in FIG. 5A are arranged in three columns maximum at a pitch of 0.8 mm in the X direction. In addition, the plurality of signal vias S13 are arranged in four rows at a pitch of 1.6 mm in the Y direction. Similarly, the plurality of signal vias S23 are arranged in three columns maximum at a pitch of 0.8 mm in the X direction. In addition, the plurality of signal vias S23 are arranged in four rows at a pitch of 1.6 mm in the Y direction. As illustrated in FIG. 5B, two signal traces $S11_1$ and $S11_2$ and the ground trace G1 are disposed between two signal vias S23 arranged at a pitch of 1.6 mm in the Y direction.

At this time, the plurality of signal vias S12 positioned near the plurality of signal terminals 12 of the memory controller 130 are also preferably arranged at a pitch of 0.8 mm or less in the X direction similarly to the plurality of signal vias S13 and the plurality of signal vias S23. In addition, the plurality of signal vias S12 are preferably arranged at a pitch of 1.6 mm or less in the Y direction. That is, a minimum pitch XA of the plurality of signal vias S12 is preferably equal to or less than a minimum pitch XB of the plurality of signal vias S23. The minimum pitch XA is the pitch of the plurality of signal vias S12 in the X direction in the first embodiment. The minimum pitch XB is the pitch of the plurality of signal vias S23 in the X direction in the first embodiment. The wiring efficiency is the highest when the plurality of signal vias S12 are arranged in this manner. By employing such a wiring structure, connection to the memory device 140 that is a DDR4 SDRAM can be easily established.

Figure 6B:
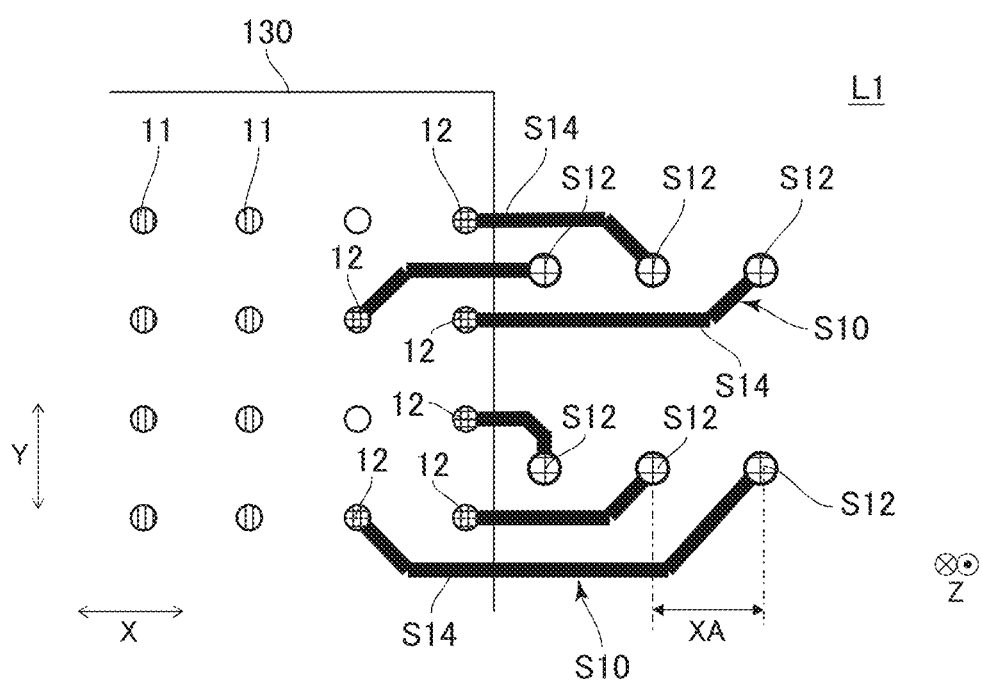
FIG. 6B is a plan view of part of a control unit according to a modification example of the first embodiment.

FIG. 6B is a partial plan view of part of the control module 110 according to a modification example of the first embodiment, that is, part of the memory controller 130 and the printed wiring board 200. In this modification example, the memory device 140 is a DDR3 SDRAM. The DDR3 SDRAM has a different terminal layout from the DDR4 SDRAM. Therefore, the flexibility of the wiring is high because changing the signal vias S12 to which the signal traces S14 are connected in the conductor layer L1 from FIG. 6A is sufficient.

To be noted, in the conductor layer L1, a ground trace can be also provided between the signal traces S14 and the signal vias S12. Therefore, the ground trace can be also provided between two signal traces S14, and radiated noise and crosstalk can be reduced. In addition, electromagnetic coupling of the signal traces S14 and the signal vias S12 with other signal lines or power lines can be also reduced.

By employing the wiring structure illustrated in FIG. 5 as described above, the meandering wiring of all the signal lines for the address/command signals interconnecting the memory controller 130 and the memory device 140 can be shortened or omitted. In addition, since the ground lines are formed on both sides of the signal lines in the width direction with the insulator therebetween, impedance fluctuation of the wiring can be reduced, and detour of the return path can be also avoided.

In addition, in the first embodiment, a pad shape with which the wiring width and wiring pitch of the printed wiring board 200 can be sufficiently secured and the mountability of the memory device 140 in the printed wiring board 200 is not degraded can be employed. Further, since the wiring length difference between the signal line S10 and the signal line S20 can be reduced, the interval between the memory controller 130 and the memory device 140 can be reduced, and therefore the wiring area can be reduced.

EXAMPLE 1-1

In the wiring structure illustrated in FIG. 3B corresponding to the first embodiment, a wiring length difference $\Delta d$ between the wiring length of the signal line S10 and the wiring length of the signal line S20 was obtained. To be noted, a direction from the memory controller 130 to the memory device 140 parallel to the X direction will be referred to as an X1 direction. The X1 direction will be indicated by a positive value, and a direction opposite to the X1 direction will be indicated by a negative value. In addition, a direction parallel to the Z direction and upward from the main surface 201 in FIG. 3B will be referred to as a Z1 direction. The Z1 direction will be indicated by a positive value, and a direction opposite to the Z1 direction will be indicated by a negative value.

A distance from the signal terminal 11 to the signal terminal 12 in the X1 direction is represented by $\Delta d1$. A distance from the signal terminal 13 to the signal terminal 14 in the X1 direction is represented by $\Delta d2$. A difference obtained by subtracting the sum of the lengths of the signal vias S22 and S23 in the Z1 direction from the sum of the lengths of the signal vias S12 and S13 in the Z1 direction is represented by $\Delta d3$. The wiring length difference $\Delta d$ between the wiring length of the signal line S10 and the wiring length of the signal line S20 can be roughly calculated by $\Delta d = \Delta d1 + \Delta d2 + \Delta d3$.

Rough calculation was performed in the following conditions. The pitch of the terminals of the memory controller 130 was set to 0.8 mm, which was equal to the pitch of the terminals of the memory device 140.

The two signal terminals 12 illustrated in FIG. 3B are provided on the outer periphery and the second column of the memory controller 130. In addition, the two signal terminals 11 illustrated in FIG. 3B are provided in the third and fourth columns of the memory controller 130. As the conditions for roughly calculating the wiring length difference $\Delta d$, the following terminals were used. That is, among the two signal terminals 11, the signal terminal 11 in the fourth column of the memory controller 130 was used. In addition, in the two signal terminals 12, the signal terminal 12 positioned on the outer periphery of the memory controller 130 was used. In addition, among the two signal terminals 13, the signal terminal 13 in the column farther from the memory controller 130 was used. Among the two signal terminals 14, the signal terminal 14 in the column closer to the memory controller 130 was used.

The thickness of the printed wiring board 200 was set to 1.6 mm. The distance between the conductor layer L1 and the conductor layer L2 and the distance between the conductor layer L4 and the conductor layer L3 were each set to 100 μm. The wiring of each of the signal lines S10 and S20 in the conductor layer L1 was assumed to be the same, and thus calculation was omitted.

Δd1, Δd2, and Δd3 were calculated in the conditions described above, and the results are as follows.

$$\Delta d1 = 0.8 \text{ mm} \times (-3 \text{ pitch}) = -2.4 \text{ mm}$$

$$\Delta d2 = 0.8 \text{ mm} \times (6 \text{ pitch}) = 4.8 \text{ mm}$$

$$\Delta d3 = (0.1 \text{ mm} \times 2 \text{ Via}) - (1.6 \text{ mm} \times 2 \text{ Via}) = -3.0 \text{ mm}$$

Therefore, the wiring length difference Δd between the signal line S10 and the signal line S20 was as follows.

$$\Delta d = (-2.4 \text{ mm}) + (4.8 \text{ mm}) + (-3.0 \text{ mm}) = -0.6 \text{ mm}$$

Comparative Example 1-1

Next, the same calculation was also performed for the wiring structure illustrated in FIG. 12B corresponding to the comparative example. A distance from the signal terminal 11X to the signal terminal 12X in the X1 direction is represented by Δd1X. A distance from the signal terminal 13X to the signal terminal 14X in the X1 direction is represented by Δd2X. A difference obtained by subtracting the sum of the lengths of the signal vias S22X and S23X in the Z1 direction from the sum of the lengths of the signal vias of the signal lines S10X in the Z1 direction is represented by Δd3. The wiring length difference ΔdX between the wiring length of the signal line S10X and the wiring length of the signal line S20X can be roughly calculated by ΔdX=Δd1X+Δd2X+Δd3X. The sectional structure of the printed wiring board 200X was set to be the same as the sectional structure of the printed wiring board 200 illustrated in FIG. 3B.

Δd1X, Δd2X, and Δd3X were calculated in the conditions described above, and the results are as follows.

$$\Delta d1X = 0.8 \text{ mm} \times (-3 \text{ pitch}) = -2.4 \text{ mm}$$

$$\Delta d2X = 0.8 \text{ mm} \times (-6 \text{ pitch}) = -4.8 \text{ mm}$$

$$\Delta d3X = 0 - (1.6 \text{ mm} \times 2 \text{ Via}) = -3.2 \text{ mm}$$

Therefore, the wiring length difference ΔdX between the signal line S10X and the signal line S20X was as follows.

$$\Delta dX = (-2.4 \text{ mm}) + (-4.8 \text{ mm}) + (-3.2 \text{ mm}) = -10.4 \text{ mm}$$

Comparison between Example 1-1 and Comparative Example 1-1

In Example 1-1, the wiring length difference Δd was −0.6 mm, and the wiring length difference ΔdX was −10.4 mm in Comparative Example 1-1. Therefore, in Example 1-1, the wiring length difference can be reduced as compared with Comparative Example 1-1.

EXAMPLE 1-2

Example 1-2 will be described below with reference to FIGS. 3A to 5C. The printed wiring board 200 of Example 1-2 was a four-layer board including through vias. The layer structure of the printed wiring board 200 of Example 1-2 was set as follows. That is, the thickness of the conductor layer L1 in the Z direction was set to 37 μm. The thickness of the insulating layer between the conductor layer L1 and the conductor layer L2 in the Z direction was set to 100 μm. The thickness of the conductor layer L2 in the Z direction was set to 35 μm. The thickness of the insulating layer between the conductor layer L2 and the conductor layer L3 was set to 1200 μm. The thickness of the conductor layer L3 in the Z direction was set to 35 μm. The thickness of the insulating layer between the conductor layer L3 and the conductor layer L4 in the Z direction was set to 100 μm. The thickness of the conductor layer L4 in the Z direction was set to 37 μm.

The width of each of the signal traces $S11_1$ and $S11_2$ in the cross-section illustrated in FIG. 3C was set to 125 μm. The width of each portion of the ground trace G1 in the cross-section illustrated in FIG. 3C was set to 100 μm. The interval between all signal traces and the ground trace was set to 87.5 mm. The intervals between the ground trace and the through vias formed at respective ends in the wiring direction of the signal traces was set to 75 μm. The ground trace was disposed in the conductor layer L1, and a power supply trace for supplying power potential was disposed in the conductor layer L3.

The via pad diameter of the through vias was set to be 550 μm maximum. A pitch Y1 between two signal vias $S23_1$ and $S23_2$ arranged in the Y direction was set to 1.6 mm. By employing the wiring structure described above, the two signal traces $S11_1$ and $S11_2$ and the ground trace G1 can be provided between the two signal vias $S23_1$ and $S23_2$ arranged in the Y direction. In addition, the two signal lines S10 passing through the conductor layer L2 and the two signal lines S20 passing through the conductor layer L4 can be provided in the printed wiring board 200. Therefore, all the signal lines S10 and S20 extending in the X direction can be provided in the region illustrated in FIGS. 5A to 5C.

In the printed wiring board 200, a region to which the signal terminals 11 and 12 of the memory controller 130 are connected can be also formed in a similar manner to the wiring structure of the memory device 140 illustrated in FIGS. 5A to 5C. As a result of this, all the signal lines S10 and S20 extending from the memory device 140 to the memory controller 130 can be formed in the shortest path, and in each signal trace, a ground trace can be provided on both sides of the signal trace in the width direction with insulator therebetween. Further, since a ground trace is formed between the signal trace and the through via, the signal lines do not come close to each other. In addition, crosstalk between a signal line and a signal via of another signal line, and crosstalk between the signal line and a power via of a power line can be also reduced.

For example, in the case where the via pad shape of the through via is different between the conductor layer L2 and the conductor layer L4, the wiring width of the ground trace G1 or the ground trace G2 near the via pad of the through via can be increased. By causing part of the ground trace G1 and part of the ground trace G2 to overlap each other as viewed in the Z direction, the ground trace G1 and the ground trace G2 can be easily electrically interconnected by the through via. As a result of this, the properties of the ground are improved. For example, in a section along the line illustrated in FIGS. 5B and 5C where no through via is present, a through via for interconnecting the ground traces G1 and G2 can be easily provided.

Meanwhile, the pitch of the plurality of signal vias S13 in the X direction and the pitch of the plurality of signal vias S23 in the X direction are each an integer multiple of the pitch of the terminals of the memory device 140. Therefore, the minimum pitch of the plurality of signal vias S13 in the X direction and the minimum pitch of the plurality of signal vias S23 in the X direction are each 0.8 mm. By setting the clearance diameter between the ground traces G1 and G2 and the through via penetrating these to Φ0.65 mm or less, a ground line having a width of 75 μm or more can be formed between through vias provided at the minimum pitch. By employing such a structure, crosstalk between the signal lines and the through vias of the power potential can be also reduced.

To be noted, the pad diameter of the through via and the wiring structure may be adjusted in consideration of the required specifications of the memory system and the productivity of the printed wiring board 200. For example, the width and pitch of each of the signal traces and the ground trace in the cross-section illustrated in FIG. 3C can be respectively changed to 0.1 mm and 0.09 mm. In addition, the wiring width and wiring pitch of all the elements do not need to be equal. For example, the width of the ground trace near the through vias may be larger, or width of part of the ground trace positioned between two signal traces may be changed.

Although a structure in which the entirety in the Y direction of the wiring pattern disposed in the conductor layer L2 overlaps the entirety in the Y direction of the wiring pattern disposed in the conductor layer L4 as viewed in the Z direction is employed in the cross-section illustrated in FIG. 3C, the configuration is not limited to this. It suffices as long as part or entirety in the Y direction of the wiring pattern disposed in the conductor layer L2 overlaps part or entirety in the Y direction of the wiring pattern disposed in the conductor layer L4 as viewed in the Z direction. For example, it suffices as long as part or entirety in the Y direction of the signal trace $S11_1$ overlaps part or entirety in the Y direction of the signal trace $S21_1$ as viewed in the Z direction. The same applies for the ground traces G1 and G2.

In addition, the pitch Y1 is not limited to 1.6 mm, and may be set appropriately in accordance with the shape of the pads or the pitch of the pads. It suffices as long as the signal trace S11 is provided between signal vias S23 arranged in the Y direction and the ground trace G1 is provided on both sides of the signal trace S11 with insulator therebetween.

In addition, the number of the signal lines S10 and the number of the signal lines S20 are not limited to the examples described above. In addition, the number of the signal lines S10 and the number of the signal lines S20 may be equal or different.

Any of the ground trace, the power supply trace, and other signal traces may be disposed in each of the conductor layers L1 and L3. For example, approximately the entirety of the conductor layer L1 or L3 may be formed as a ground trace. In addition, the signal traces each preferably have a uniform sectional structure at each position in the direction in which the signal trace extends, that is, in the X direction.

In addition, as a result of the wiring structure of Example 1-2, the wiring length difference between the plurality of signal lines S10 and the plurality of signal lines S20 was reduced. As a result of this, the memory controller 130 and the memory device 140 were arranged as close as possible at an interval of 2 mm between the outer shapes thereof. In addition, all the wiring related to the memory system was accommodated in a wiring region of 13 mm×17 mm from an end portion of the outer shape of the memory controller 130. In contrast, in Comparative Example 1-2 corresponding to the control module 110X of the comparative example illustrated in FIGS. 12A to 12C, the memory controller 130X and the memory device 140X needed to be arranged at an interval or 7 mm or more. Therefore, as a result of the wiring structure of Example 1-2, the printed wiring board 200 was miniaturized.

To be noted, although a case where the pitch of the terminals of the memory controller 130 is equal to the pitch of the terminals of the memory device 140 has been described, the pitches may be different. The positions and number of columns of the signal terminal 11 and the signal terminals 12 may be arbitrarily set in accordance with the specifications of the semiconductor element that is the memory controller 130. In addition, the center of gravity of the plurality of terminals including the signal terminals 11 and 12 of the memory controller 130 is defined in accordance with the distance between the memory controller 130 and the memory device 140. The memory device 140 is not limited to a device in which the interval between a terminal group and another terminal group is larger than the inter-terminal pitch like the DDR4 SDRAM. In addition, the DDR4 SDRAM may be a semiconductor package including 78 terminals arranged in 12 rows×9 columns. Also in the semiconductor package including 78 terminals, similarly to the semiconductor package including 96 terminals, terminals are provided in the first to third columns and the seventh to ninth columns, and no terminal is provided in the fourth to sixth columns. That is, the memory device 140 may be a semiconductor package including 96 terminals, or a semiconductor package including 78 terminals.

Although a case where the first semiconductor element is the memory controller 130 and the second semiconductor element is the memory device 140 has been described, the configuration is not limited to this. The first semiconductor element may be a semiconductor element different from the memory controller 130, and the second semiconductor element may be a semiconductor element different from the memory device 140. Also in this case, the second semiconductor element is not limited to a device in which the interval between a terminal group and another terminal group is larger than the inter-terminal pitch like the DDR4 SDRAM.

In addition, the thickness of the printed wiring board 200, the thickness of each of the conductor layers L1 to L4, and the thickness of each insulating layer are not limited to the example described above. The wiring structure and the wiring length may be determined in accordance with the operation frequency of the memory system and specifications of the semiconductor elements.

Second Embodiment

Figure 7:
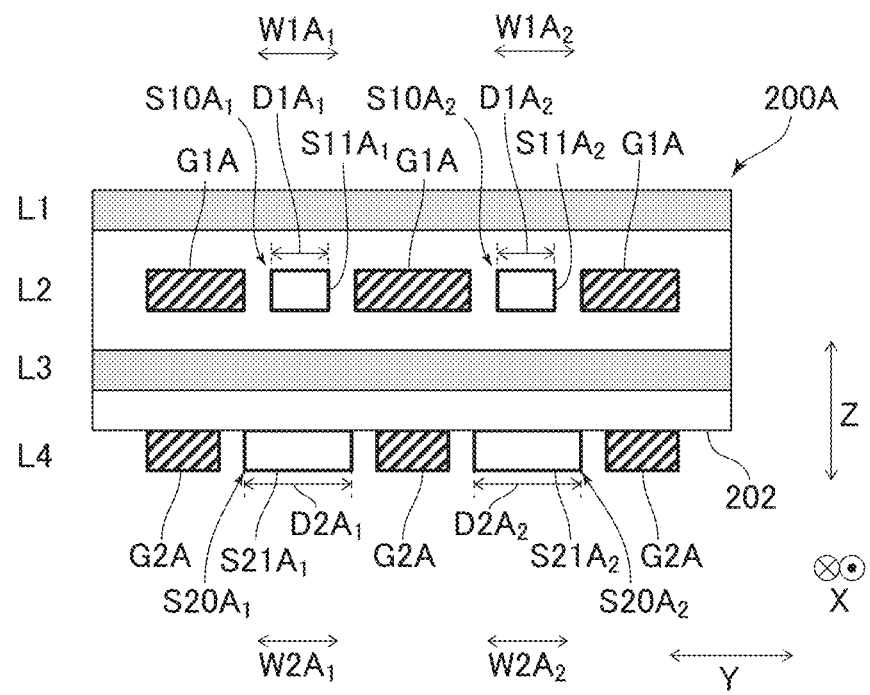
FIG. 7 is a section view of a printed wiring board according to a second embodiment.

A second embodiment will be described. FIG. 7 is a section view of a printed wiring board 200A according to the second embodiment. In the second embodiment, the printed wiring board 200A is used instead of the printed wiring board 200 in the control module 110 of the first embodiment. The other elements are substantially the same as in the first embodiment. In the second embodiment, substantially the same elements as in the first embodiment will be denoted by the same reference signs, and description thereof will be omitted.

The printed wiring board 200A of the second embodiment is a four-layer board similarly to the printed wiring board 200 of the first embodiment. The printed wiring board 200A includes signal lines $S10A_1$ and $S10A_2$ serving as examples of a first signal line, and signal lines $S20A_1$ and $S20A_2$ serving as examples of a second signal line. In addition, the printed wiring board 200A includes a ground trace G1A serving as an example of a first ground trace, and a ground trace G2A serving as an example of a second ground trace.

The signal line $S10A_1$ includes a signal trace $S11A_1$ serving as an example of a first signal trace. The signal line $S10A_2$ includes a signal trace $S11A_2$ serving as an example of a first signal trace. The signal line $S20A_1$ includes a signal trace $S21A_1$ serving as an example of a second signal trace. The signal line $S20A_2$ includes a signal trace $S21A_2$ serving as an example of a second signal trace. The signal traces $S11A_1$ and $S11A_2$ are disposed in the conductor layer L2. The ground trace G1A is disposed at the same position as the signal traces $S11A_1$ and $S11A_2$ in the Z direction, that is, in the same conductor layer L2. The signal traces $S21A_1$ and $S21A_2$ are disposed in the conductor layer L4, that is, on the main surface 202. The ground trace G2A is disposed at the same position as the signal traces $S21A_1$ and $S21A_2$ in the Z direction, that is, in the same conductor layer L4. That is, the ground trace G2A is disposed on the main surface 202.

The ground trace G1A extends in the X direction along the signal trace $S11A_1$ such that the signal trace $S11A_1$ is interposed between two parts thereof in a width direction $W1A_1$ of the signal trace $S11A_1$. Similarly, the ground trace G1A extends in the X direction along the signal trace $S11A_2$ such that the signal trace $S11A_2$ is interposed between two parts thereof in a width direction $W1A_2$ of the signal trace $S11A_2$.

In addition, the ground trace G2A extends in the X direction along the signal trace $S21A_1$ such that the signal trace $S21A_1$ is interposed between two parts thereof in a width direction $W2A_1$ of the signal trace $S21A_1$. Similarly, the ground trace G2A extends in the X direction along the signal trace $S21A_2$ such that the signal trace $S21A_2$ is interposed between two parts thereof in a width direction $W2A_2$ of the signal trace $S21A_2$. In FIG. 7, the signal traces $S11A_1$, $S11A_2$, $S21A_1$, and $S21A_2$ all extend in the X direction, and therefore the width directions $W1A_1$, $W1A_2$, $W2A_1$, and $W2A_2$ are parallel to the Y direction.

As viewed in the Z direction, at least part of the signal trace $S11A_1$ overlaps at least part of the signal trace $S21A_1$. As a result of this, further miniaturization of the printed wiring board 200A can be realized. As viewed in the Z direction, half or more of the area of the signal trace $S11A_1$ preferably overlaps half or more of the area of the signal trace $S21A_1$. The signal trace $S11A_2$ and the signal trace $S21A_2$ are also provided in substantially the same manner. In addition, as viewed in the Z direction, at least part of the ground trace G1A overlaps at least part of the ground trace G2A. As a result of this, the ground trace G1A and the ground trace G2A can be interconnected by, for example, a via conductor, and thus it is easier to electrically connect the ground trace G1A to the ground trace G2A.

Here, insulating layers are provided on both sides in the Z direction of each of the signal traces $S11A_1$ and $S11A_2$ disposed inside the printed wiring board 200A. In contrast, a solder resist or air is present on one of two sides in the Z direction of each of the signal traces $S21A_1$ and $S21A_2$ disposed in the conductor layer L4 serving as an outer layer. The solder resist is thinner than the insulating layer. In addition, the dielectric constant of the solder resist and air is lower than the dielectric constant of the epoxy resin constituting the insulating layers. As described above, the dielectric constant of the surroundings of the signal traces $S21A_1$ and $S21A_2$ closer to the air is lower than the dielectric constant of the signal traces $S11A_1$ and $S11A_2$.

The output characteristic of the transmission circuit for the address/command signal in the memory controller and the input characteristic of the reception circuit for the address/command signal in the memory device are typically equivalent because these circuits are typically constituted by the same circuit for all the address/command signals. Therefore, it is desirable that the signal lines $10A_1$, the signal lines $20A_1$, the signal lines $10A_2$, and the signal lines $20A_2$ have equivalent characteristic impedances.

In the second embodiment, the signal trace $S11A_1$ has a smaller width than the signal trace $S21A_1$. That is, a width $D1A_1$ of the signal trace $S11A_1$ is smaller than a width $D2A_1$ of the signal trace $S21A_1$. Similarly, the signal trace $S11A_2$ has a smaller width than the signal trace $S21A_2$. That is, a width $D1A_2$ of the signal trace $S11A_2$ is smaller than a width $D2A_2$ of the signal trace $S21A_2$.

Therefore, the characteristic impedance of the signal trace $S11A_1$ is made closer to the characteristic impedance of the signal trace $S21A_1$ closer to the air by reducing the width $D1A_1$. That is, the characteristic impedance of the signal trace $S11A_1$ is approximately equal to the characteristic impedance of the signal trace $S21A_1$. Similarly, the characteristic impedance of the signal trace $S11A_2$ is made closer to the characteristic impedance of the signal trace $S21A_2$ closer to the air by reducing the width $D1A_2$. That is, the characteristic impedance of the signal trace $S11A_2$ is approximately equal to the characteristic impedance of the signal trace $S21A_2$. As a result of this, the width of the ground trace G1A in the conductor layer L2 can be increased, and thus the characteristics of the ground trace G1A can be stabilized.

In addition, part or entirety in the Y direction of the wiring pattern disposed in the conductor layer L2 preferably overlaps part or entirety in the Y direction of the wiring pattern disposed in the conductor layer L4 as viewed in the Z direction. For example, part or entirety in the Y direction of the signal trace $S11A_1$ may overlap part or entirety in the Y direction of the signal trace $S21A_1$ as viewed in the Z direction. The same applies to the ground traces G1A and G2A.

Third Embodiment

Figure 8:
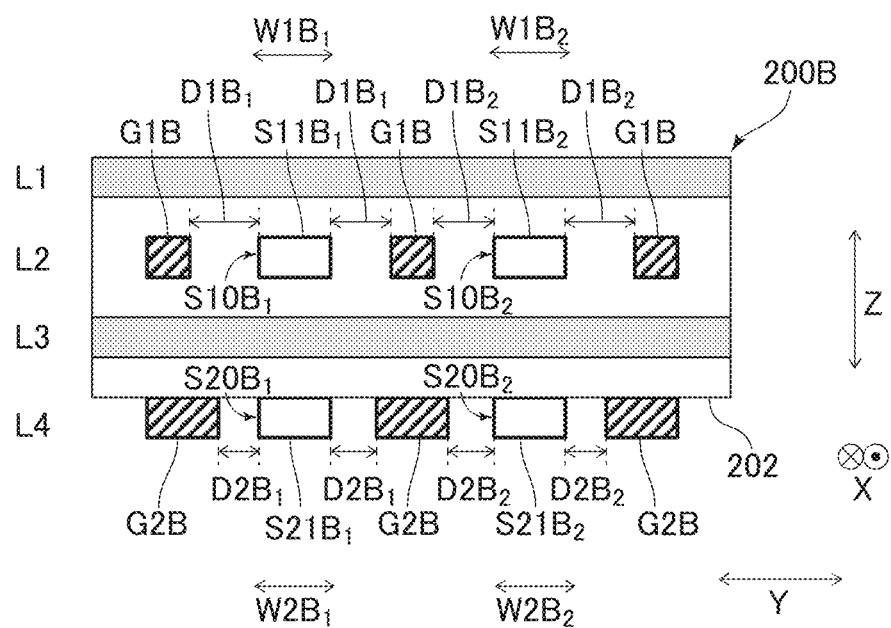
FIG. 8 is a section view of a printed wiring board according to a third embodiment.

A third embodiment will be described. FIG. 8 is a section view of a printed wiring board 200B according to the third embodiment. In the third embodiment, the printed wiring board 200B is used instead of the printed wiring board 200 in the control module 110 of the first embodiment. The other elements are substantially the same as in the first embodiment. In the third embodiment, substantially the same elements as in the first embodiment will be denoted by the same reference signs, and description thereof will be omitted.

The printed wiring board 200B of the third embodiment is a four-layer board similarly to the printed wiring board 200 of the first embodiment. The printed wiring board 200B includes signal lines $S10B_1$ and $S10B_2$ serving as examples of a first signal line, and signal lines $S20B_1$ and $S20B_2$ serving as examples of a second signal line. In addition, the printed wiring board 200B includes a ground trace G1B serving as an example of a first ground trace, and a ground trace G2B serving as an example of a second ground trace.

The signal line $S10B_1$ includes a signal trace $S11B_1$ serving as an example of a first signal trace. The signal line $S10B_2$ includes a signal trace $S11B_2$ serving as an example of a first signal trace. The signal line $S20B_1$ includes a signal trace $S21B_1$ serving as an example of a second signal trace. The signal line $S20B_2$ includes a signal trace $S21B_2$ serving as an example of a second signal trace. The signal traces $S11B_1$ and $S11B_2$ are disposed in the conductor layer L2. The ground trace G1B is disposed at the same position as the signal traces $S11B_1$ and $S11B_2$ in the Z direction, that is, in the same conductor layer L2. The signal traces $S21B_1$ and $S21B_2$ are disposed in the conductor layer L4, that is, on the main surface 202. The ground trace G2B is disposed at the same position as the signal traces $S21B_1$ and $S21B_2$ in the Z direction, that is, in the same conductor layer L4. That is, the ground trace G2B is disposed on the main surface 202.

The ground trace G1B extends in the X direction along the signal trace $S11B_1$ such that the signal trace $S11B_1$ is interposed between two parts thereof in a width direction $W1B_1$ of the signal trace $S11B_1$. Similarly, the ground trace G1B extends in the X direction along the signal trace $S11B_2$ such that the signal trace $S11B_2$ is interposed between two parts thereof in a width direction $W1B_2$ of the signal trace $S11B_2$.

In addition, the ground trace G2B extends in the X direction along the signal trace $S21B_1$ such that the signal trace $S21B_1$ is interposed between two parts thereof in a width direction $W2B_1$ of the signal trace $S21B_1$. Similarly, the ground trace G2B extends in the X direction along the signal trace $S21B_2$ such that the signal trace $S21B_2$ is interposed between two parts thereof in a width direction $W2B_2$ of the signal trace $S21B_2$. In FIG. 8, the signal traces $S11B_1$, $S11B_2$, $S21B_1$, and $S21B_2$ all extend in the X direction, and therefore the width directions $W1B_1$, $W1B_2$, $W2B_1$, and $W2B_2$ are parallel to the Y direction.

As viewed in the Z direction, at least part of the signal trace $S11B_1$ overlaps at least part of the signal trace $S21B_1$. As a result of this, further miniaturization of the printed wiring board 200B can be realized. As viewed in the Z direction, half or more of the area of the signal trace $S11B_1$ preferably overlaps half or more of the area of the signal trace $S21B_1$. The signal trace $S11B_2$ and the signal trace $S21B_2$ are also provided in substantially the same manner. In addition, as viewed in the Z direction, at least part of the ground trace G1B overlaps at least part of the ground trace G2B. As a result of this, the ground trace G1B and the ground trace G2B can be interconnected by, for example, a via conductor, and thus it is easier to electrically connect the ground trace G1B to the ground trace G2B.

Here, insulating layers are provided on both sides in the Z direction of each of the signal traces $S11B_1$ and $S11B_2$ disposed inside the printed wiring board 200B. In contrast, a solder resist or air is present on one of two sides in the Z direction of each of the signal traces $S21B_1$ and $S21B_2$ disposed in the conductor layer L4 serving as an outer layer. The solder resist is thinner than the insulating layer. In addition, the dielectric constant of the solder resist and air is lower than the dielectric constant of the epoxy resin constituting the insulating layers. As described above, the dielectric constant of the surroundings of the signal traces $S21B_1$ and $S21B_2$ closer to the air is lower than the dielectric constant of the signal traces $S11B_1$ and $S11B_2$. In addition, in a four-layer through board, the thickness of the conductor layer L2 is often set to be larger than the thickness of the conductor layer L4.

The output characteristic of the transmission circuit for the address/command signals in the memory controller and the input characteristic of the reception circuit for the address/command signals in the memory device are typically equivalent because these circuits are typically constituted by the same circuit for all the address/command signals. Therefore, it is desirable that the signal lines $10B_1$, the signal lines $20B_1$, the signal lines $S10B_2$, and the signal lines $S20B_2$ have equivalent characteristic impedances.

In the third embodiment, a distance $D1B_1$ between the signal trace $S11B_1$ and the ground trace G1B is larger than a distance $D2B_1$ between the signal trace $S21B_1$ and the ground trace G2B. Similarly, a distance $D1B_2$ between the signal trace $S11B_2$ and the ground trace G1B is larger than a distance $D_2B_2$ between the signal trace $S_{21}B_2$ and the ground trace G2B.

Therefore, the characteristic impedance of the signal trace $S11B_1$ is made closer to the characteristic impedance of the signal trace $S21B_1$ closer to the air by increasing the distance $D1B_1$. That is, the characteristic impedance of the signal trace $S11B_1$ is approximately equal to the characteristic impedance of the signal trace $S21B_1$. Similarly, the characteristic impedance of the signal trace $S11B_2$ is made closer to the characteristic impedance of the signal trace $S_{21}B_2$ closer to the air by increasing the distance $D1B_2$. That is, the characteristic impedance of the signal trace $S11B_2$ is approximately equal to the characteristic impedance of the signal trace $S_{21}B_2$. As a result of this, the width of the ground trace G1B in the conductor layer L4 can be increased, and thus the characteristics of the ground trace G1B can be stabilized.

In addition, part or entirety in the Y direction of the wiring pattern disposed in the conductor layer L2 preferably overlaps part or entirety in the Y direction of the wiring pattern disposed in the conductor layer L4 as viewed in the Z direction. For example, part or entirety in the Y direction of the signal trace $S11B_1$ may overlap part or entirety in the Y direction of the signal trace $S21B_1$ as viewed in the Z direction. The same applies to the ground traces G1B and G2B.

Fourth Embodiment

Figure 9A:
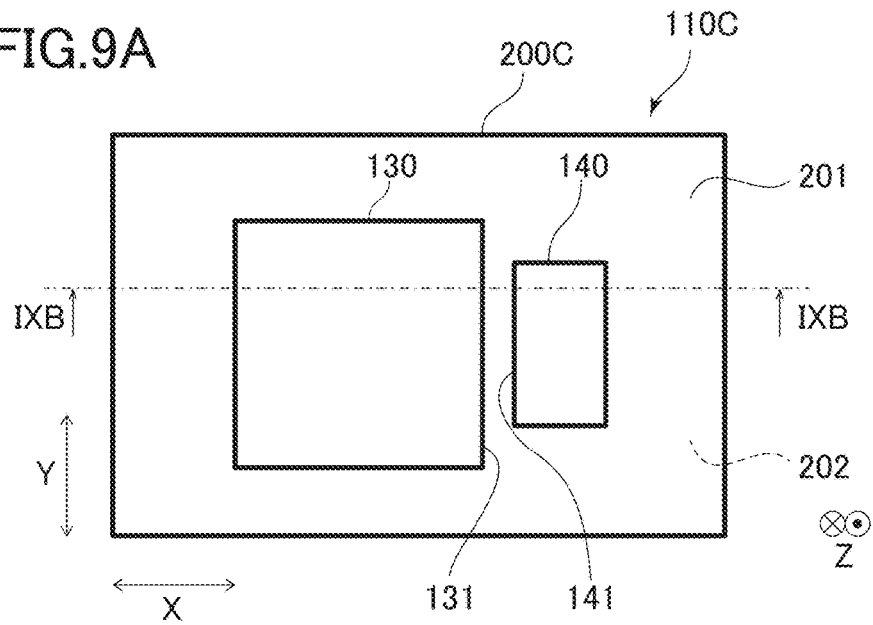
FIG. 9A is a plan view of part of a control module serving as an example of an electronic module according to a fourth embodiment.
Figure 9B:
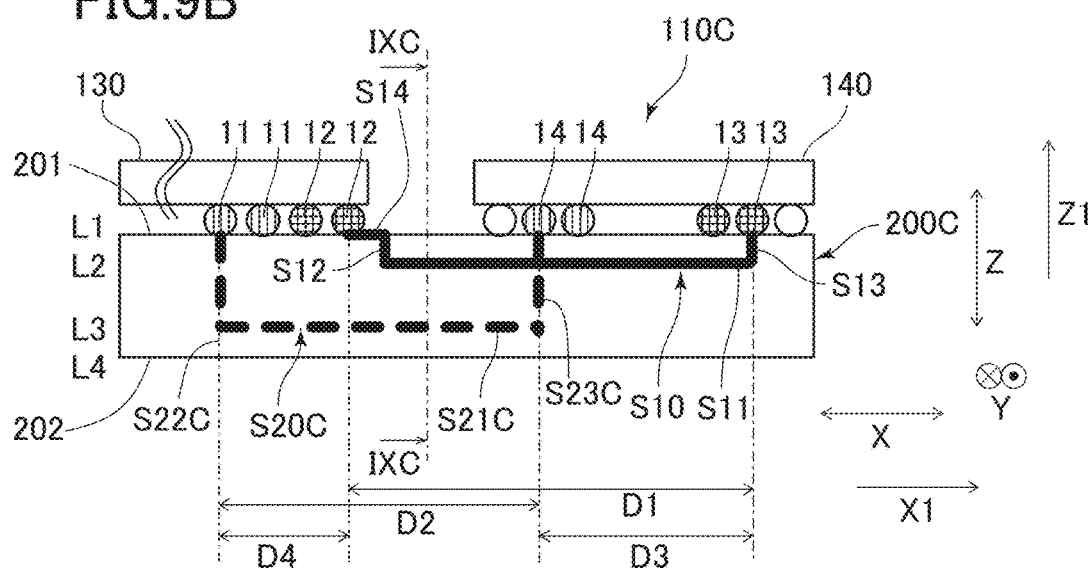
FIG. 9B is a section view of the control module according to the fourth embodiment.
Figure 9C:
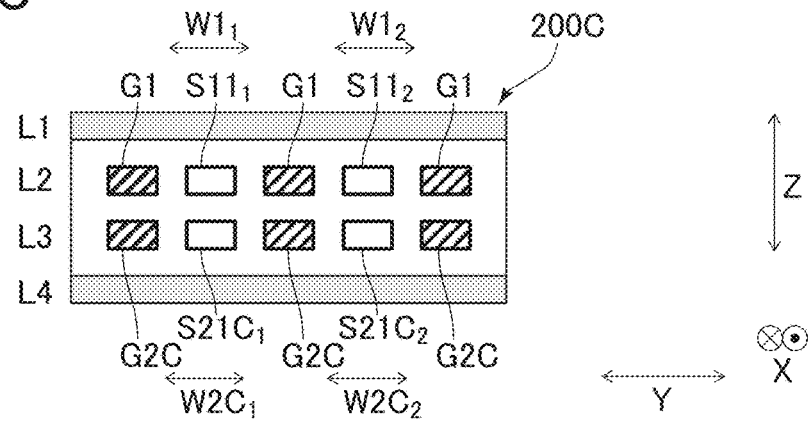
FIG. 9C is a section view of a printed wiring board according to the fourth embodiment.

A fourth embodiment will be described. FIG. 9A is a plan view of part of a control module 110C serving as an electronic module according to the fourth embodiment. FIG. 9B is a section view of the control module 110C according to the fourth embodiment. FIG. 9B schematically illustrates a cross-section of the control module 110C taken along a line IXB-IXB illustrated in FIG. 9A. FIG. 9C is a section view of the printed wiring board 200C according to the fourth embodiment. FIG. 9C schematically illustrates a cross-section of the printed wiring board 200C taken along a line IXC-IXC of FIG. 9B. In the fourth embodiment, the control module 110C is used instead of the control module 110 of the first embodiment. The other elements are substantially the same as in the first embodiment. In the fourth embodiment, substantially the same elements as in the first embodiment will be denoted by the same reference signs, and description thereof will be omitted.

The control module 110C includes the memory controller 130 and the memory device 140 similarly to the first embodiment. In addition, the control module 110C includes the printed wiring board 200C. The printed wiring board 200C is a rigid printed wiring board. In addition, the printed wiring board 200C is a through via board. By using a through via board as the printed wiring board 200C, the productivity can be high, and the production cost can be low.

The memory controller 130 and the memory device 140 are disposed on the printed wiring board 200C so as not to overlap each other as viewed in the Z direction. In addition, the memory controller 130 and the memory device 140 are disposed on the printed wiring board 200C so as to oppose each other in the X direction such that the side 131 of the memory controller 130 and the side 141 of the memory device 140 are parallel to each other as viewed in the Z direction. In the fourth embodiment, the memory controller 130 and the memory device 140 are both disposed on the main surface 201 among two main surfaces 201 and 202 of the printed wiring board 200C. As illustrated in FIG. 9B, similarly to the first embodiment, the distance D1 between the signal terminal 12 and the signal terminal 13 is larger than the distance D2 between the signal terminal 11 and the signal terminal 14. In addition, the distance D3 between the signal terminal 13 and the signal terminal 14 is larger than the distance D4 between the signal terminal 11 and the signal terminal 12 similarly to the first embodiment.

The printed wiring board 200C is a laminated board including at least four conductor layers L1 to L4 similarly to the first embodiment. The conductor layers L1 to L4 are arranged in the order of the conductor layer L1, the conductor layer L2, the conductor layer L3, and the conductor layer L4 from the main surface 201 toward the main surface 202. Similarly to the first embodiment, the printed wiring board 200C includes the plurality of signal lines S10 that electrically connect the plurality of signal terminals 12 of the memory controller 130 to the plurality of signal terminals 13 of the memory device 140 in a one-on-one relationship. In addition, the printed wiring board 200C includes a plurality of signal lines S20C that electrically connect the plurality of signal terminals 11 of the memory controller 130 to the plurality of signal terminals 14 of the memory device 140 in a one-on-one relationship. In the fourth embodiment, the configuration of the signal lines S20C is different from the configuration of the signal lines S20 of the first embodiment.

The signal lines S10 each serve as an example of a first signal line. The signal lines S20C each serve as an example of a second signal line. The wiring width of each of the signal lines S10 and S20C is preferably 75 μm or more. To be noted, FIG. 9B illustrates only one signal line S10 and one signal line S20C.

Description will be given below focusing on one signal line S10 and one signal line S20C. The signal line S10 includes the signal trace S11 serving as an example of a first signal trace, the signal via S12, the signal via S13, and the signal trace S14. The signal line S20C includes a signal trace S21C serving as an example of a second signal trace. The signal trace S21C is disposed in the conductor layer L3. To be noted, an unillustrated power supply trace or an unillustrated ground trace may be disposed in each of the conductor layers L1 and L4.

In addition, the signal line S20C includes a signal via S22C and a signal via S23C. The signal via S22C is a via conductor that electrically interconnects the signal terminal 11 and the signal trace S21C by being in contact with an unillustrated signal trace of the conductor layer L1 connected to the signal terminal 11 and the signal trace S21C of the conductor layer L3. In the fourth embodiment, the signal via S22C is a part between the conductor layer L1 and the conductor layer L3 in a through via.

The signal via S23C is a via conductor that electrically interconnects the signal terminal 14 and the signal trace S21C by being in contact with an unillustrated signal trace of the conductor layer L1 connected to the signal terminal 14 and the signal trace S21C of the conductor layer L3. In the fourth embodiment, the signal via S23C is a part between the conductor layer L1 and the conductor layer L3 in a through via.

As described above, since the signal line S10 and the signal line S20C have the wiring structures described above in the printed wiring board 200C, the difference between the path length of the signal line S10 and the path length of the signal line S20C is reduced. Therefore, the meandering wiring of the signal lines S10 and S20C can be shortened or omitted, thus the wiring area of each of the signal lines S10 and S20C as viewed in the Z direction can be reduced, and the difference in the delay time of the address/command signal between the signal terminals 13 and 14 can be reduced. Therefore, the quality of the signals is improved, and miniaturization of the printed wiring board 200C, that is, miniaturization of the control module 110C can be realized.

As illustrated in FIG. 9C, two signal traces S11 of two signal lines S10 among the plurality of signal lines S10 will be referred to as signal traces $S11_1$ and $S11_2$. In addition, as illustrated in FIG. 9C, two signal traces S21C of two signal lines S20C among the plurality of signal lines S20C will be referred to as signal traces $S21C_1$ and $S21C_2$.

The printed wiring board 200C includes ground traces G1 and G2C. The ground trace G1 serves as an example of a first ground trace. The ground trace G2C serves as an example of a second ground trace. The ground trace G1 is disposed at the same position as the signal traces $S11_1$ and $S11_2$ in the Z direction, that is, disposed in the same conductor layer L2. The ground trace G2C is disposed at the same position as the signal traces $S21C_1$ and $S21C_2$ in the Z direction, that is, disposed in the same conductor layer L3.

Further, the ground trace G1 extends in the X direction along the signal trace $S11_1$ such that the signal trace $S11_1$ is interposed between two parts thereof in the width direction $W1_1$ of the signal trace $S11_1$. Similarly, the ground trace G1 extends in the X direction along the signal trace S112 such that the signal trace S112 is interposed between two parts thereof in the width direction $W1_2$ of the signal trace S112.

In addition, the ground trace G2C extends in the X direction along the signal trace $S21C_1$ such that the signal trace $S21C_1$ is interposed between two parts thereof in a width direction $W2C_1$ of the signal trace $S21C_1$. Similarly, the ground trace G2C extends in the X direction along the signal trace $S21C_2$ such that the signal trace $S21C_2$ is interposed between two parts thereof in a width direction $W2C_2$ of the signal trace $S21C_2$. In FIG. 9C, the signal traces $S11_1$, $S11_2$, $S21C_1$, and $S21C_2$ all extend in the X direction, and therefore the width directions $W1_1$, $W1_2$, $W2C_1$, and $W2C_2$ are parallel to the Y direction.

As described above, in the fourth embodiment, the ground trace G2C are disposed on both sides of each of the signal traces $S21C_1$ and $S21C_2$ in the Y direction with insulator therebetween. That is, the ground trace G2C at the reference potential is disposed to adjacent to each of the signal traces $S21C_1$ and $S21C_2$ with insulator therebetween such that each of the signal traces $S21C_1$ and $S21C_2$ are interposed between ground trace G2C. As a result of the ground trace G2C, a path for a return current corresponding to the signal flowing in each of the signal traces $S21C_1$ and $S21C_2$ can be secured, and thus mismatch of the characteristic impedance in each of the signal lines S20C can be reduced. As a result of this, reflection of signals in each of the signal lines S20C can be reduced. Therefore, the quality of the signals is improved, and further the radiated noise can be reduced. In addition, since a ground trace G2C is present between each pair of signal lines S20C, crosstalk in each signal line S20C can be also reduced, and thus the quality of signals can be improved. The same effect is also obtained for the signal lines S10.

To be noted, a power supply trace for supplying a power potential to the memory controller 130 and the memory device 140 can be formed in the conductor layer L4. Alternatively, a power supply trace for supplying a power potential can be formed in the conductor layer L1 to form a ground trace in the conductor layer L4.

As viewed in the Z direction, at least part of the signal trace $S11_1$ overlaps at least part of the signal trace $S21C_1$. As a result of this, further miniaturization of the printed wiring board 200C can be realized. As viewed in the Z direction, half or more of the area of the signal trace $S11_1$ preferably overlaps half or more of the area of the signal trace $S21C_1$. The signal trace $S11_2$ and the signal trace $S21C_2$ are also provided in substantially the same manner. In addition, as viewed in the Z direction, at least part of the ground trace G1 overlaps at least part of the ground trace G2C. As a result of this, the ground trace G1 and the ground trace G2C can be interconnected by, for example, a via conductor, and thus it is easier to electrically connect the ground trace G1 to the ground trace G2C.

EXAMPLE 4-1

In the wiring structure illustrated in FIG. 9B corresponding to the fourth embodiment, a wiring length difference ΔdC between the wiring length of the signal line S10 and the wiring length of the signal line S20C was obtained.

A distance from the signal terminal 11 to the signal terminal 12 in the X1 direction is represented by Δd1C. A distance from the signal terminal 13 to the signal terminal 14 in the X1 direction is represented by Δd2C. A difference obtained by subtracting the sum of the lengths of the signal vias S22C and S23C in the Z1 direction from the sum of the lengths of the signal vias S12 and S13 in the Z1 direction is represented by Δd3C. The wiring length difference ΔdC between the wiring length of the signal line S10 and the wiring length of the signal line S20C can be roughly calculated by ΔdC=Δd1C+Δd2C+Δd3C. To be noted, the sectional structure of the printed wiring board 200C was set to be the same as the sectional structure of the printed wiring board 200 of the first embodiment illustrated in FIG. 3C.

Δd1C, Δd2C, and Δd3C were calculated in the conditions described above, and the results are as follows.

Δ$d1C$=0.8 mm×(−3 pitch)=−2.4 mm

Δ$d2C$=0.8 mm×(6 pitch)=4.8 mm

Δ$d3C$=(0.1 mm×2 Via)−(1.5 mm×2 Via)=−2.8 mm

The wiring length difference ΔdC between the signal line S10 and the signal line S20C was as follows.

Δ$dC$=(−2.4 mm)+(4.8 mm)+(−2.8 mm)=−0.4 mm

Therefore, in Example 4-1, the wiring length difference ΔdC can be reduced as compared with Comparative Example 1-1. As described above, the wiring length difference ΔdC can be also reduced in the configuration in which the signal traces S21C are disposed in the conductor layer L3. In addition, all the signal lines S10 and S20C can be provided in the printed wiring board 200C.

EXAMPLE 4-2

Figure 10A:
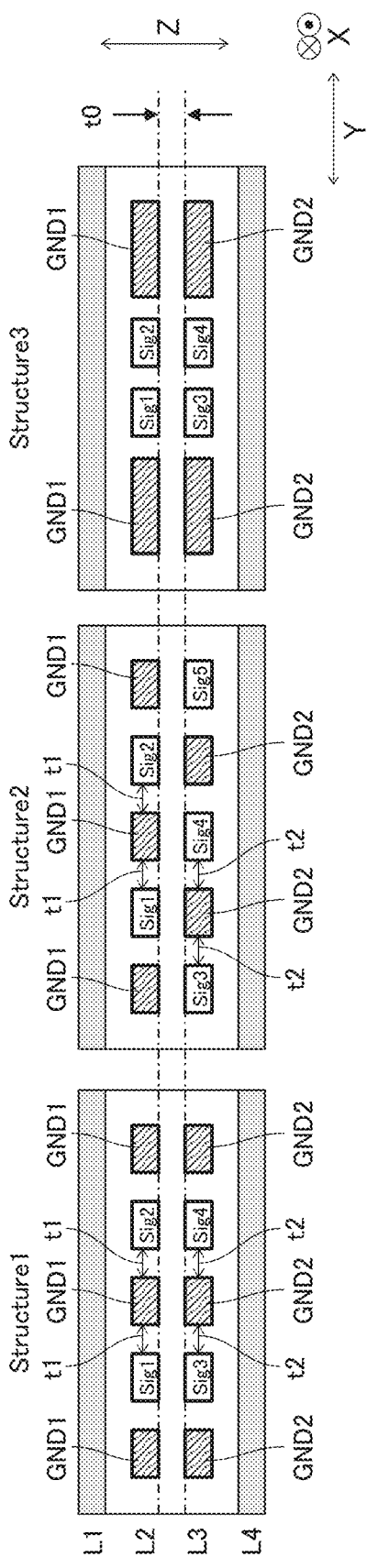
FIG. 10A is a section view of three printed wiring boards in Example 4-2.

FIG. 10A is a section view of three printed wiring boards in Example 4-2. FIG. 10A illustrates a wiring structure including a wiring pattern formed in the conductor layer L2 and a wiring pattern formed in the conductor layer L3.

Structure 1 corresponds to a first wiring structure of Example 4-2. Signal traces Sig1 and Sig2 and a ground trace GND1 are disposed in the conductor layer L2. Signal traces Sig3 and Sig4 and a ground trace GND2 are disposed in the conductor layer L3. The ground trace GND1 or GND2 is disposed on both sides of the signal traces Sig1 to Sig4 in the Y direction with insulator therebetween. The width of each wiring trace is set to 125 μm, and the interval between wiring traces is set to 87.5 μm.

Structure 2 corresponds to a second wiring structure of Example 4-2. Signal traces Sig1 and Sig2 and the ground trace GND1 are disposed in the conductor layer L2. Signal traces Sig3 to Sig5 and the ground trace GND2 are disposed in the conductor layer L3. The signal traces Sig1 to Sig5 are each disposed to oppose the ground trace GND1 or GND2 in the Y direction with insulator therebetween. The ground trace GND1 or GND2 is disposed on both sides of the signal traces Sig1, Sig2, and Sig4 in the Y direction with insulator therebetween. On one side in the Y direction of each of the signal traces Sig3 and Sig5, an unillustrated other signal line or an unillustrated through via set to the power potential is disposed to oppose the signal trace Sig3 or Sig5 with insulator therebetween. On the other side, the ground trace GND2 is disposed to oppose the signal traces Sig3 and Sig5 with insulator therebetween. The wiring width and pitch in Structure 2 is equal to those in Structure 1. In Structure 2, for conditions for comparing the electric characteristics described above, only the signal traces Sig1 to Sig4 are subjected to comparison. This is because the electric characteristics of the signal trace Sig5 can be regarded as equivalent to those of the signal trace Sig3.

Structure 3 corresponds to a wiring structure of Comparative Example 4. The ground trace GND1 or GND2 is disposed on one of two sides of each of the signal traces Sig1 to Sig4 in the Y direction with insulator therebetween. Meanwhile, the signal traces Sig1 and Sig2 are disposed to oppose each other in the Y direction with insulator therebetween, and the signal traces Sig3 and Sig4 are disposed to oppose each other in the Y direction with insulator therebetween. The width of each of the ground traces GND1 and GND2 in the Y direction was set to 218.5 μm.

In the sectional structure of the printed wiring board of each of Structures 1 to 3, the distance t0 between the conductor layers L2 and L3 in the Z direction was set to 400 μm. The other dimensions of each of the conductor layers and the insulating layers were set to be the same as in Example 1-2.

Figure 10C:
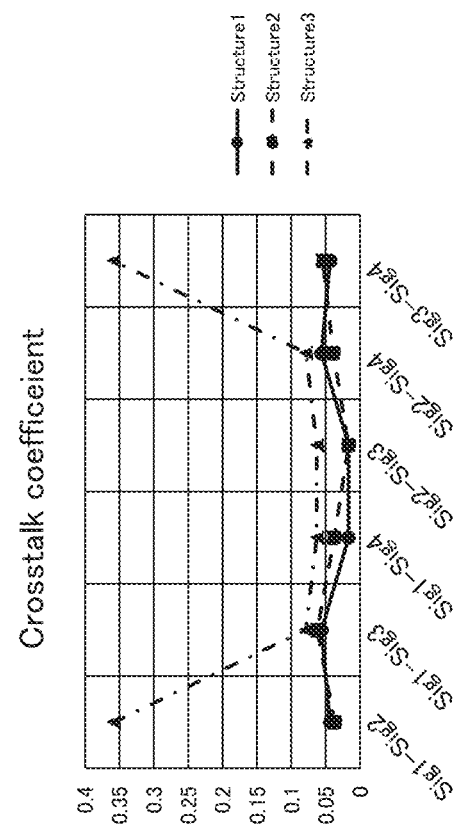
FIG. 10C is a graph of a crosstalk coefficient of Example 4-2.
Figure 10B:
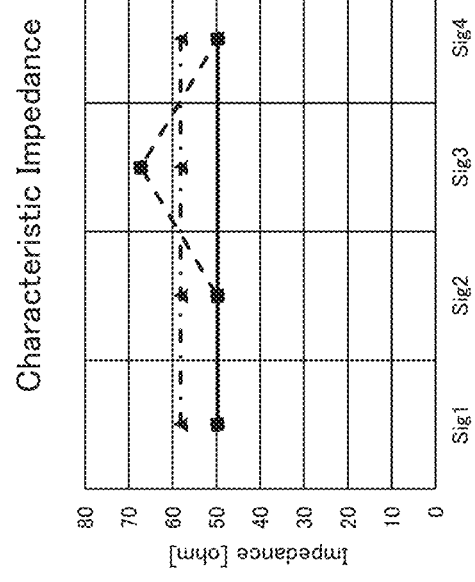
FIG. 10B is a graph of characteristic impedance of Example 4-2.

FIG. 10B is a graph illustrating results of calculation of the characteristic impedance of the signal traces Sig1 to Sig4 in Structures 1 to 3.

In Structure 1, the characteristic impedance of each of the signal traces Sig1 to Sig4 was constant at 50Ω.

In Structure 2, the characteristic impedance of each of the signal traces Sig1, Sig2, and Sig4 on both sides of which the ground trace GND1 or GND2 was disposed with insulator therebetween was 50Ω. In contrast, the characteristic impedance of the signal trace Sig3 on only one side of which the ground trace GND2 was disposed with insulator therebetween increased to 67Ω.

In Structure 3, the characteristic impedance of each of the signal traces Sig1 to Sig4 was 59Ω, which is a high value.

Therefore, by employing the wiring structure of Structure 1, the characteristic impedance of the signal traces Sig1 to Sig4 can be made uniform and reduced. That is, in view of the characteristic impedance, the wiring structures of Structures 1 and 2 are preferable, and the wiring structure of Structure 1 is the most preferable. To be noted, in Structure 2, the shape of the signal waveform derived from the characteristic impedance can be improved by, for example, using a termination resistor.

FIG. 10C is a graph illustrating results of calculation of the crosstalk coefficient between two signal traces in Structures 1 to 3. When the common impedance in the two signal traces is represented by Zc and the differential mode impedance is represented by Zd, the crosstalk coefficient can be calculated by (Zc−Zd)/(Zc+Zd).

In Structures 1 and 2, the signal traces Sig1 and Sig3 opposing each other with the insulating layer between the conductor layers L2 and L3 therebetween are most strongly electromagnetically coupled. The crosstalk coefficient in Structure 1 was 0.056. The crosstalk coefficient in Structure 2 was 0.062. In contrast, the crosstalk coefficient in Structure 3 was a value greater than the crosstalk coefficient in Structure 1 and the crosstalk coefficient in Structure 2. In addition, it was confirmed that the crosstalk coefficient in Structure 2 was reduced to a lower value than in Structure 1 in the case where the distance t0 was set to 300 m.

The distance between the signal trace Sig1 or Sig2 and the ground trace GND1 in the Y direction will be denoted by t1 and the distance between the signal trace Sig3 or Sig4 and the ground trace GND2 will be denoted by t2. In Structures 1 and 2, the distance t0 is preferably 4 times or greater of the shorter one of the distances t1 and t2. Particularly, in Structure 1, the distance t0 is preferably 4 times or greater of the shorter one of the distances t1 and t2. In these conditions, the crosstalk between the signal trace Sig1 and the signal trace Sig3 and the crosstalk between the signal trace Sig2 and the signal trace Sig4 can be effectively reduced. Particularly, the crosstalk can be more effectively reduced in Structure 1.

Fifth Embodiment

Figure 11A:
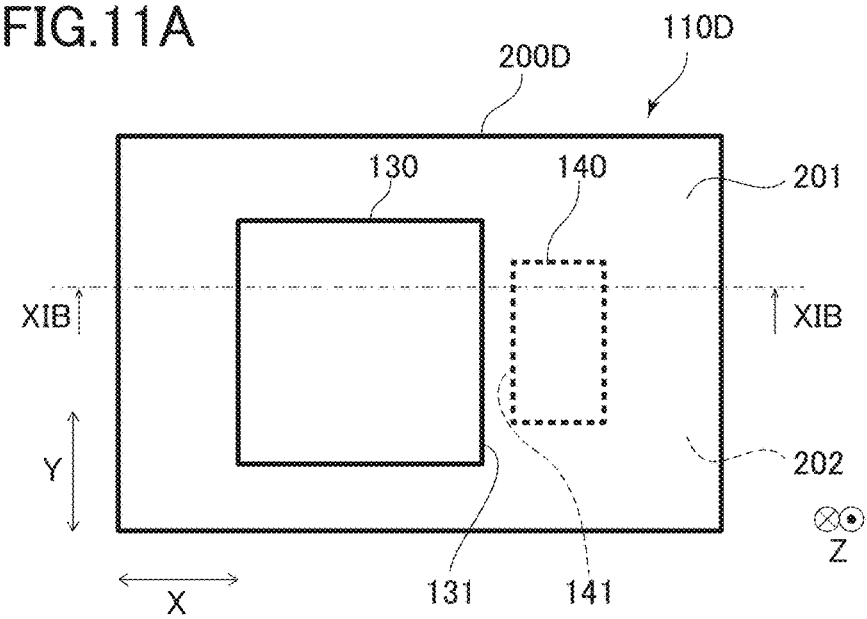
FIG. 11A is a plan view of part of a control module serving as an example of an electronic module according to a fifth embodiment.
Figure 11B:
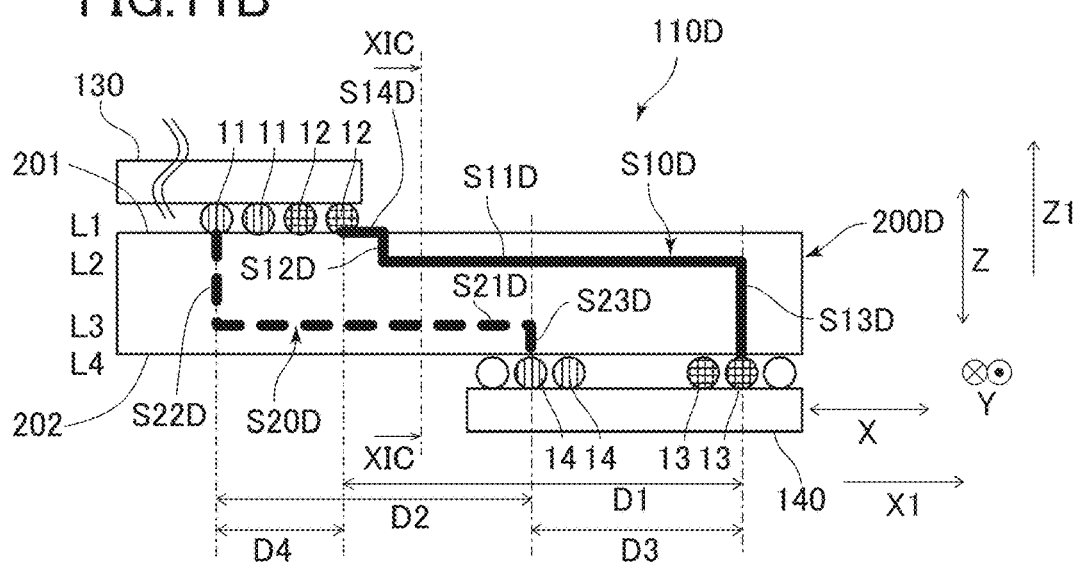
FIG. 11B is a section view according to the fifth embodiment.
Figure 11C:
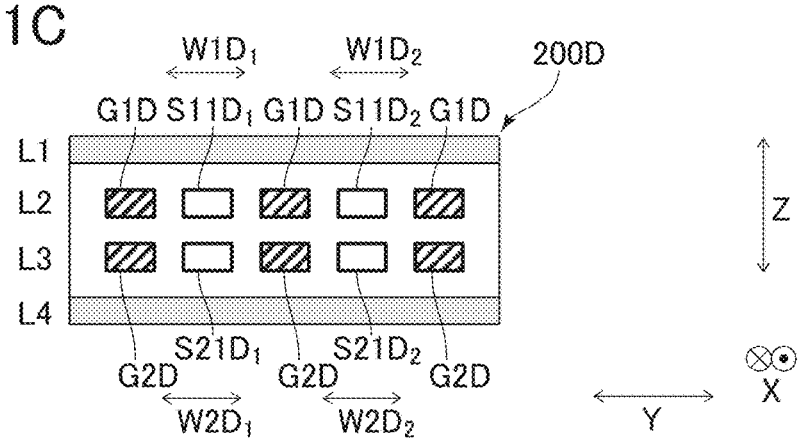
FIG. 11C is a section view of a printed wiring board according to the fifth embodiment.

A fifth embodiment will be described. FIG. 11A is a plan view of part of a control module 110D serving as an electronic module according to the fifth embodiment. FIG. 11B is a section view of the control module 110D according to the fifth embodiment. FIG. 11B schematically illustrates a cross-section of the control module 110D taken along a line XIB-XIB illustrated in FIG. 11A. FIG. 11C is a section view of a printed wiring board 200D according to the fifth embodiment. FIG. 11C schematically illustrates a cross-section of the printed wiring board 200D taken along a line XIC-XIC of FIG. 11B. In the fifth embodiment, the control module 110D is used instead of the control module 110 of the first embodiment. The other elements are substantially the same as in the first embodiment. In the fifth embodiment, substantially the same elements as in the first embodiment will be denoted by the same reference signs, and description thereof will be omitted.

The control module 110D includes the memory controller 130 and the memory device 140 similarly to the first embodiment. In addition, the control module 110D includes the printed wiring board 200D. The printed wiring board 200D is a rigid printed wiring board. In addition, the printed wiring board 200D is a through via board. By using a through via board as the printed wiring board 200D, the productivity can be high, and the production cost can be low.

The memory controller 130 and the memory device 140 are disposed on the printed wiring board 200D so as not to overlap each other as viewed in the Z direction. In addition, the memory controller 130 and the memory device 140 are disposed on the printed wiring board 200D so as to oppose each other in the X direction such that the side 131 of the memory controller 130 and the side 141 of the memory device 140 are parallel to each other as viewed in the Z direction. In the fifth embodiment, the memory controller 130 and the memory device 140 are respectively disposed on different main surfaces among the two main surfaces 201 and 202 of the printed wiring board 200D. In the example of FIGS. 11A and 11B, the memory controller 130 is disposed on the main surface 201, and the memory device 140 is disposed on the main surface 202. To be noted, the memory device 140 may be disposed on the main surface 201, and the memory controller 130 may be disposed on the main surface 202.

As illustrated in FIG. 11B, similarly to the first embodiment, the distance D1 between the signal terminal 12 and the signal terminal 13 is larger than the distance D2 between the signal terminal 11 and the signal terminal 14. In addition, similarly to the first embodiment, the distance D3 between the signal terminal 13 and the signal terminal 14 is larger than the distance D4 between the signal terminal 11 and the signal terminal 12.

The printed wiring board 200D is a laminated board including at least four conductor layers L1 to L4 similarly to the first embodiment. The conductor layers L1 to L4 are arranged in the order of the conductor layer L1, the conductor layer L2, the conductor layer L3, and the conductor layer L4 from the main surface 201 toward the main surface 202. The printed wiring board 200D includes a plurality of signal lines S10D that electrically connect the plurality of signal terminals 12 of the memory controller 130 to the plurality of signal terminals 13 of the memory device 140 in a one-on-one relationship. In addition, the printed wiring board 200D includes a plurality of signal lines S20D that electrically connect the plurality of signal terminals 11 of the memory controller 130 to the plurality of signal terminals 14 of the memory device 140 in a one-on-one relationship. In the fifth embodiment, the configurations of the signal lines S10D and S20D are different from the configurations of the signal lines S10 and S20 of the first embodiment.

The signal lines S10D each serve as an example of a first signal line. The signal lines S20D each serve as an example of a second signal line. The wiring width of each of the signal lines S10D and S20D is preferably 75 μm or more. To be noted, FIG. 11B illustrates only one signal line S10D and one signal line 520D.

Description will be given below focusing on one signal line S10D and one signal line 520D. The signal line S10D includes a signal trace S11D serving as an example of a first signal trace, a signal via S12D, a signal via S13D, and a signal trace S14D. The signal trace S14D is disposed in the conductor layer L1, and is electrically connected to the signal terminal 12 by being in contact with the signal terminal 12. The signal trace S11D is disposed in the conductor layer L2.

The signal via S12D is a via conductor that electrically interconnects the signal terminal 12 and the signal trace S11D by being in contact with the signal trace S14D of the conductor layer L1 connected to the signal terminal 12 and the signal trace S11D of the conductor layer L2. In the present embodiment, the signal via S12D is a portion between the conductor layer L1 and the conductor layer L2 in the through via.

The signal via S13D is a via conductor that electrically interconnects the signal terminal 13 and the signal trace S11D by being in contact with an unillustrated signal trace of the conductor layer L4 connected to the signal terminal 13 and the signal trace S11D of the conductor layer L2. In the present embodiment, the signal via S13D is a portion between the conductor layer L2 and the conductor layer L4 in the through via.

The signal line S20D includes a signal trace S21D serving as an example of a second signal trace, a signal via S22D, and a signal via S23D. The signal trace S21D is disposed in the conductor layer L3.

The signal via S22D is a via conductor that electrically interconnects the signal terminal 11 and the signal trace S21D by being in contact with an unillustrated signal trace of the conductor layer L1 connected to the signal terminal 11 and the signal trace S21D of the conductor layer L3. In the fifth embodiment, the signal via S22D is a part between the conductor layer L1 and the conductor layer L3 in a through via.

The signal via S23D is a via conductor that electrically interconnects the signal terminal 14 and the signal trace S21D by being in contact with an unillustrated signal trace of the conductor layer L4 connected to the signal terminal 14 and the signal trace S21D of the conductor layer L3. In the fifth embodiment, the signal via S23D is a part between the conductor layer L3 and the conductor layer L4 in a through via. To be noted, an unillustrated power supply trace or an unillustrated ground trace may be disposed in each of the conductor layers L1 and L4.

As described above, since the signal line S10D and the signal line S20D have the wiring structures described above in the printed wiring board 200D, the difference between the path length of the signal line S10D and the path length of the signal line S20D is reduced. Therefore, the meandering wiring of the signal lines S10D and S20D can be shortened or omitted, thus the wiring area of each of the signal lines S10D and S20D as viewed in the Z direction can be reduced, and the difference in the delay time of the address/command signal between the signal terminals 13 and 14 can be reduced. Therefore, the quality of the signals is improved, and miniaturization of the printed wiring board 200D, that is, miniaturization of the control module 110D can be realized.

As illustrated in FIG. 11C, two signal traces S11D of two signal lines S10D among the plurality of signal lines S10D will be referred to as signal traces $S11D_1$ and $S11D_2$. In addition, as illustrated in FIG. 11C, two signal traces S21D of two signal lines S20D among the plurality of signal lines S20D will be referred to as signal traces $S21D_1$ and $S21D_2$.

The printed wiring board 200D includes ground traces G1D and G2D. The ground trace G1D serves as an example of a first ground trace. The ground trace G2D serves as an example of a second ground trace. The ground trace G1D is disposed at the same position as the signal traces $S11D_1$ and $S11D_2$ in the Z direction, that is, disposed in the same conductor layer L2. The ground trace G2D is disposed at the same position as the signal traces $S21D_1$ and $S21D_2$ in the Z direction, that is, disposed in the same conductor layer L3.

Further, the ground trace G1D extends in the X direction along the signal trace $S11D_1$ such that the signal trace $S11D_1$ is interposed between two parts thereof in the width direction $W1D_1$ of the signal trace $S11D_1$. Similarly, the ground trace G1D extends in the X direction along the signal trace $S11D_2$ such that the signal trace $S11D_2$ is interposed between two parts thereof in the width direction $W1D_2$ of the signal trace $S11D_2$.

In addition, the ground trace G2D extends in the X direction along the signal trace $S21D_1$ such that the signal trace $S21D_1$ is interposed between two parts thereof in a width direction $W2D_1$ of the signal trace $S21D_1$. Similarly, the ground trace G2D extends in the X direction along the signal trace $S21D_2$ such that the signal trace $S21D_2$ is interposed between two parts thereof in a width direction $W2D_2$ of the signal trace $S21D_2$. In FIG. 11C, the signal traces $S11D_1$, $S11D_2$, $S21D_1$, and $S21D_2$ all extend in the X direction, and therefore the width directions $W1D_1$, $W1D_2$, $W2D_1$, and $W2D_2$ are parallel to the Y direction.

As described above, in the fifth embodiment, the ground trace G1D is disposed on both sides of each of the signal traces $S11D_1$ and $S11D_2$. That is, the ground trace G1D at the reference potential is disposed to oppose each of the signal traces $S11D_1$ and $S11D_2$ with insulator therebetween such that each of the signal traces $S11D_1$ and $S11D_2$ is interposed between two parts of the ground trace G1D. As a result of the ground trace G1D, a path for a return current corresponding to the signal flowing in each of the signal traces $S11D_1$ and $S11D_2$ can be secured, and thus mismatch of the characteristic impedance in each of the signal lines S10D can be reduced. As a result of this, reflection of signals in each of the signal lines S10D can be reduced. Therefore, the quality of the signals is improved, and further the radiated noise can be reduced. In addition, since the ground trace G1D is present between each pair of signal lines S10D, crosstalk in each signal line S10D can be also reduced, and thus the quality of signals can be improved. The same effect is also obtained for the signal lines S20D.

As viewed in the Z direction, at least part of the signal trace $S11D_1$ overlaps at least part of the signal trace $S21D_1$. As a result of this, further miniaturization of the printed wiring board 200D can be realized. As viewed in the Z direction, half or more of the area of the signal trace $S11D_1$ preferably overlaps half or more of the area of the signal trace $S21D_1$. The signal trace $S11D_2$ and the signal trace $S21D_2$ are also provided in substantially the same manner. In addition, as viewed in the Z direction, at least part of the ground trace G1D overlaps at least part of the ground trace G2D. As a result of this, the ground trace G1D and the ground trace G2D can be interconnected by, for example, a via conductor, and thus it is easier to electrically connect the ground trace G1D to the ground trace G2D.

EXAMPLE 5

In the wiring structure illustrated in FIG. 11B corresponding to the fifth embodiment, a wiring length difference MD between the wiring length of the signal line S10D and the wiring length of the signal line S20D was obtained.

A distance from the signal terminal 11 to the signal terminal 12 in the X1 direction is represented by Δd1D. A distance from the signal terminal 13 to the signal terminal 14 in the X1 direction is represented by Δd2D. A difference obtained by subtracting the sum of the lengths of the signal vias S22D and S23D in the Z1 direction from the sum of the lengths of the signal vias S12D and S13D in the Z1 direction is represented by Δd3D. The wiring length difference ΔdD between the wiring length of the signal line S10D and the wiring length of the signal line S20D can be roughly calculated by ΔdD=Δd1D+Δd2D+Δd3D. To be noted, the sectional structure of the printed wiring board 200D was set to be the same as the sectional structure of the printed wiring board 200 of the first embodiment illustrated in FIG. 3C.

Δd1D, Δd2D, and Δd3D were calculated in the conditions described above, and the results are as follows.

Δd1D=0.8 mm×(−3 pitch)=−2.4 mm

Δd2D=0.8 mm×(6 pitch)=4.8 mm

Δd3D=(0.1 mm+1.5 mm)−(1.5 mm+0.1 mm)=0 mm

The wiring length difference ΔdD between the signal line S10 and the signal line S20D was as follows.

ΔD=(−2.4 mm)+(4.8 mm)+(0 mm)=2.4 mm

Therefore, in Example 5, the wiring length difference ΔdD can be reduced as compared with Comparative Example 1-1. As described above, the wiring length difference ΔdD can be also reduced in the configuration in which the memory controller 130 and the memory device 140 are disposed on different main surfaces of the printed wiring board 200D. In addition, all the signal lines S10D and S20D can be provided in the printed wiring board 200D.

The distance in the Z direction between the conductor layer L2 and the conductor layer L3 is preferably 4 times or more of the shorter one of the distance in the Y direction between the signal trace S11D and the ground trace G1D and the distance in the Y direction between the signal trace S21D and the ground trace G2D.

To be noted, although a case where the signal traces S11D and the signal traces S21D are disposed inside the printed wiring board 200D, that is, respectively disposed in the conductor layers L2 and L3 that are inner layers have been described, the configuration is not limited to this. For example, in the case where the signal traces S11D are disposed in an inner layer, the signal traces S21D may be disposed on the main surface 202, that is, in the conductor layer L4. In addition, in the case where the signal traces S21D are disposed in an inner layer, the signal traces S11D may be disposed on the main surface 201, that is, in the conductor layer L1.

The present invention is not limited to the embodiments described above, and can be modified in many ways within the technical concept of the present disclosure. In addition, the effects described in the embodiments are merely enumeration of the most preferable effects that can be obtained from the present invention, and the effects of the present disclosure are not limited to those described in the embodiments.

Although a case where the electronic module is a control module that is a memory system including a memory controller and a memory device has been described in the embodiments described above, the configuration is not limited to this. The present disclosure is preferable for an electronic module in which a plurality of signals are communicated in synchronization between a first semiconductor element and a second semiconductor element.

In addition, although a case where the printed wiring board is a four-layer board including four conductor layers has been described in the embodiments described above, the configuration is not limited to this. The present disclosure is preferable for a case where the printed wiring board is a multilayer board including four or more conductor layers. The base material of the printed wiring board may be an inorganic insulator such as ceramics. As a wiring board having a similar function to the printed wiring board, a silicon interposer in which a conductor layer is formed by a semiconductor manufacturing technique, or the like may be used. In the wiring board that is the silicon interposer, the vias of the wiring board may be through silicon vias: TSV. The electronic module can be a 2.5D-IC in which semiconductor elements are 2.5-dimensionally mounted on the wiring board or a 3D-IC in which semiconductor elements are 3-dimensionally mounted on the wiring board, and the semiconductor elements mounted on the wiring board may be referred to as chips or chiplets. The bonding between the wiring board and the semiconductor elements is not limited to solder bonding, and may be direct bonding between metals, or hybrid bonding in which both of insulator bonding and metal bonding are used.

In addition, although a case where the electronic device is an image forming apparatus has been described in the embodiments described above, the configuration is not limited to this. The electronic module of the present disclosure is applicable to any electronic device. For example, the electronic module of the present disclosure is applicable to electronic devices such as image pickup devices like digital cameras, smartphones, tablet PCs, desktop PCs, laptop PCs, and gaming devices.

According to the present disclosure, an electronic module in which the quality of signals is improved and miniaturization is realized can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-201846, filed Dec. 13, 2021, which is hereby incorporated by reference herein in its entirety.

What is claimed is:
1. An electronic module comprising:
a wiring board having a first main surface and a second main surface on a back side of the first main surface; and
a first semiconductor element and a second semiconductor element that are mounted on the wiring board,
wherein at least one of the first semiconductor element or the second semiconductor element is disposed on a side of the first main surface,
the first semiconductor element includes a first signal terminal and a second signal terminal that is closer to the second semiconductor element than the first signal terminal is,
the second semiconductor element includes a third signal terminal and a fourth signal terminal that is closer to the first semiconductor element than the third signal terminal is, and
the wiring board includes
a first signal line configured to electrically interconnect the second signal terminal and the third signal terminal and including a first signal trace disposed in a first conductor layer,
a second signal line configured to electrically interconnect the first signal terminal and the fourth signal terminal and including a second signal trace disposed in a second conductor layer that is closer to the second main surface than the first conductor layer is,
a first ground trace disposed in the first conductor layer and extending along the first signal trace such that the first signal trace is interposed between two parts of the first ground trace in a width direction of the first signal trace, and
a second ground trace disposed in the second conductor layer and extending along the second signal trace such that the second signal trace is interposed between two parts of the second ground trace in a width direction of the second signal trace.

2. The electronic module according to claim 1, wherein a distance between the second signal terminal and the third signal terminal is larger than a distance between the first signal terminal and the fourth signal terminal.

3. The electronic module according to claim 1, wherein a distance between the third signal terminal and the fourth signal terminal is larger than a distance between the first signal terminal and the second signal terminal.

4. The electronic module according to claim 1, wherein at least part of the first signal trace overlaps at least part of the second signal trace as viewed in a direction perpendicular to the first main surface.

5. The electronic module according to claim 1, wherein at least part of the first ground trace overlaps at least part of the second ground trace as viewed in a direction perpendicular to the first main surface.

6. The electronic module according to claim 1,
wherein the second conductor layer is disposed on the second main surface, and a width of the first signal trace is smaller than a width of the second signal trace.

7. The electronic module according to claim 1,
wherein the second conductor layer is disposed on the second main surface, and
a distance between the first signal trace and the first ground trace is larger than a distance between the second signal trace and the second ground trace.

8. The electronic module according to claim 1,
wherein the second conductor layer is disposed between the first conductor layer and the second main surface, and
a distance between the first conductor layer and the second conductor layer is 4 times or more of a smaller one of a distance between the first signal trace and the first ground trace and a distance between the second signal trace and the second ground trace.

9. The electronic module according to claim 1,
wherein the first conductor layer is disposed inside the wiring board, and
wherein the first semiconductor element and the second semiconductor element are disposed on the side of the first main surface.

10. The electronic module according to claim 1,
wherein the wiring board includes a plurality of second signal lines,
the plurality of second signal lines includes a plurality of first signal vias disposed at positions closer to the second semiconductor element than to the first semiconductor element,
the first signal trace includes an extending portion extending from the second semiconductor element toward the first semiconductor element, and
the extending portion is disposed to pass through a gap between two first signal vias that are arranged with the gap therebetween in a direction intersecting a direction in which the extending portion extends and that are included in the plurality of first signal vias.

11. The electronic module according to claim 10, wherein the first ground trace is interposed between the two first signal vias and the extending portion of the first signal trace.

12. The electronic module according to claim 10, wherein the first ground trace is interposed between the plurality of first signal vias.

13. The electronic module according to claim 10, wherein the extending portion is a portion extending linearly.

14. The electronic module according to claim 1,
wherein the first signal line includes a second signal via disposed at a position closer to the first semiconductor element than to the second semiconductor element, and
the second signal via is disposed at such a position that the second signal via does not overlap the first semiconductor element as viewed in a direction perpendicular to the first main surface.

15. The electronic module according to claim 10,
wherein the wiring board includes a plurality of first signal lines,
the plurality of first signal lines include a plurality of second signal vias disposed at positions closer to the first semiconductor element than to the second semiconductor element, and
a minimum interval in the plurality of second signal vias is equal to or smaller than a minimum interval in the plurality of first signal vias.

16. The electronic module according to claim 1,
wherein an outer shape of the first semiconductor element and an outer shape of the second semiconductor element are each a rectangular shape as viewed in a direction perpendicular to the first main surface, and
one side of the first semiconductor element opposes one side of the second semiconductor element as viewed in the direction perpendicular to the first main surface.

17. The electronic module according to claim 1,
wherein the first semiconductor element is a memory controller, and
the second semiconductor element is a memory device.

18. The electronic module according to claim 17, wherein the memory device is a double data rate 3 synchronous dynamic random access memory or a double data rate 4 synchronous dynamic random access memory.

19. An electronic device comprising:
a casing; and
the electronic module according to claim 1 disposed inside the casing.

20. The electronic device according to claim 19, further comprising an image forming portion configured to form an image on a sheet.

* * * * *